US010418589B2

(12) United States Patent
Noh et al.

(10) Patent No.: US 10,418,589 B2
(45) Date of Patent: Sep. 17, 2019

(54) SUBSTRATE PROCESSING METHOD

(71) Applicant: WONIK IPS Co., Ltd., Pyeongtaek-si, Gyeonggi-do (KR)

(72) Inventors: Il Ho Noh, Hwaseong-si (KR); Seung Duk Bang, Pyeongtaek-si (KR); Beom Jun Kim, Osan-si (KR); Soo Ho Oh, Seoul (KR); Sin Pyoung Kim, Yeosu-si (KR)

(73) Assignee: WONIK IPS CO., LTD., Pyeongtaek-si, Gyeonggi-do (KR)

( * ) Notice: Subject to any disclaimer, the term of this patent is extended or adjusted under 35 U.S.C. 154(b) by 108 days.

(21) Appl. No.: 15/609,128

(22) Filed: May 31, 2017

(65) Prior Publication Data
US 2018/0019441 A1 Jan. 18, 2018

(30) Foreign Application Priority Data

Jul. 12, 2016 (KR) .................. 10-2016-0088197
Jul. 12, 2016 (KR) .................. 10-2016-0088201

(51) Int. Cl.
*H01L 51/56* (2006.01)
*H01L 51/52* (2006.01)
*H01L 51/00* (2006.01)

(52) U.S. Cl.
CPC .......... *H01L 51/5256* (2013.01); *H01L 51/56* (2013.01); *H01L 51/0011* (2013.01)

(58) Field of Classification Search
CPC ... H01L 51/5256; H01L 51/56; H01L 51/0011
See application file for complete search history.

(56) References Cited

U.S. PATENT DOCUMENTS

| 4,469,719 | A | * | 9/1984 | Martin | .................. | C23C 14/044 |
| | | | | | | 118/720 |
| 8,575,027 | B1 | * | 11/2013 | Barstow | ................ | C23C 14/042 |
| | | | | | | 257/E21.584 |
| 2006/0134522 | A1 | * | 6/2006 | Zhang | ..................... | C23C 14/08 |
| | | | | | | 429/231.3 |

(Continued)

FOREIGN PATENT DOCUMENTS

| CN | 1487777 A | 4/2004 |
| CN | 103904006 A | 7/2014 |

(Continued)

*Primary Examiner* — Austin Murata
(74) *Attorney, Agent, or Firm* — William Park & Associates Ltd.

(57) ABSTRACT

A substrate processing system and substrate processing method. The substrate processing system includes: a chamber; a susceptor disposed inside the chamber and allowing a substrate to be seated thereon; a mask member disposed over the substrate; and a controller for controlling an arrangement height of the mask member with respect to the substrate. Here, an encapsulation layer covering a device formed on the substrate is formed using the mask member adjusted in height by the controller. The substrate processing method includes disposing a substrate inside a chamber; disposing a mask member over the substrate inside the chamber; and forming an encapsulation layer covering a device formed on the substrate by adjusting an arrangement height of the mask member with respect to the substrate.

11 Claims, 16 Drawing Sheets

(56) References Cited

U.S. PATENT DOCUMENTS

2015/0041793 A1* 2/2015 Chan .................. H01L 51/0018
257/40
2017/0256739 A1* 9/2017 Kim .................. G02F 1/133308

FOREIGN PATENT DOCUMENTS

| JP | 2007273274 A | 10/2007 |
| JP | 200937808 A | 2/2009 |
| JP | 20143135 A | 1/2014 |
| JP | 2014118633 A | 6/2014 |

* cited by examiner

SUBSTRATE PROCESSING METHOD

CROSS-REFERENCE TO RELATED APPLICATIONS

This U.S. non-provisional patent application claims priority under 35 U.S.C. § 119 of Korean Patent Application Nos. 10-2016-0088197 filed Jul. 12, 2016 and 10-2016-0088201 filed on Jul. 12, 2016, the entire contents of which are hereby incorporated by reference.

BACKGROUND OF THE INVENTION

The present invention disclosed herein relates to a substrate processing system and method, and more particularly, to a substrate processing system and a substrate processing method which can form various structures of encapsulation layer by adjusting an arrangement height of a mask member with respect to a substrate.

An encapsulation process in a display manufacturing process or a semiconductor manufacturing process refers to a process of forming an encapsulation layer to protect an electrode and an organic layer of a device from oxygen and moisture in the air and to protect the device from external mechanical and physical impacts.

Particularly, since the lifespan of organic materials is rapidly shortened when exposed to oxygen and moisture in the air, organic materials used in an Organic Light Emitting Diode (OLED) device necessarily require an encapsulation layer for preventing external contact of organic materials.

Generally, the encapsulation layer is formed by a filling encapsulation method in which an organic material is filled between an encapsulation substrate and a TFT substrate, a frit encapsulation method in which a glass material (frit) melted by laser is used for adhesion, and a film encapsulation method in which a device is protected from the outside using a multilayered organic-inorganic complex film.

The encapsulation layer of the film encapsulation method can be formed by alternately laminating two or more different kinds of films (e.g., an organic film and an inorganic film).

As one of existing methods of manufacturing an encapsulation layer, a first mask is disposed on an upper surface of a substrate on which a device is formed in a first chamber, and a first encapsulation layer is formed to cover the device through a deposition process using a first mask. Thereafter, a second mask (e.g., having different sizes or openings) different from the first mask is disposed on the upper surface of the substrate in a second chamber, and a second encapsulation layer is formed to cover the first encapsulation layer through the deposition process using the second mask. Thereafter, a third mask different from the second mask is disposed on the upper surface of the substrate, and a third encapsulation layer is formed to cover the second encapsulation layer through the deposition process using a third mask. Thus, a method of forming the encapsulation layers has been proposed.

However, in order to form the encapsulation layer including the first to third encapsulation layers, since it is necessary to manufacture and use different types of first to third masks, each having different sizes and layer properties, there is a limitation in that it is costly and time-consuming to manufacture and maintain the masks.

Furthermore, in order to dispose the first mask to the third mask in different chambers, since devices (e.g., a mask supporting device or an alignment device) for disposing the masks in the chambers are separately manufactured in accordance with the types and specifications of the mask, the manufacturing process is complicated and inefficient, and the manufacturing cost is increased.

Also, since the deposition is performed while the masks are fixed, in order to change the structure (e.g., the deposition area) of the encapsulation layer, it is inevitable that different masks need to be separately prepared in consideration of different sizes and layer properties for the structures of each encapsulation layer. Accordingly, the manufacturing cost of the mask member is increased, and the manufacturing structure and manufacturing process of the encapsulation layer become complicated.

Accordingly, in recent years, various studies for simplifying the manufacturing structure and the manufacturing process of the encapsulation layer and for improving the process efficiency are being conducted, but further development is still required.

SUMMARY OF THE INVENTION

The present invention provides a substrate processing system and method capable of simplifying the manufacturing structure and manufacturing process of an encapsulation layer and improving the process efficiency.

The present invention also provides a substrate processing system and method, which can form an encapsulation layer having various structures by adjusting the arrangement height of a mask member with respect to a substrate.

The present invention also provides a substrate processing system and method, which can form an encapsulation layer having various structures using only one type of mask member.

The present invention also provides a substrate processing system and method, which can simplify the manufacturing structure and manufacturing process of an encapsulation layer and improve the yield.

The present invention also provides a substrate processing system and method, which can prevent infiltration of oxygen and moisture and increase the stability.

The present invention also provides a substrate processing system and method, which can standardize a mask member and reduce the cost and time required for the manufacturing and maintenance of the mask member.

Embodiments of the present invention provide substrate processing methods including: disposing a substrate inside a chamber; disposing a mask member over the substrate inside the chamber; and forming an encapsulation layer covering a device formed on the substrate by adjusting an arrangement height of the mask member with respect to the substrate.

This is to simplify the manufacturing structure and manufacturing process of encapsulation layers and to improve the process efficiency, by forming encapsulation layers of various structures using a single kind of mask member without individually preparing different kinds of mask members in order to form various structured encapsulation layers.

That is, by adjusting the arrangement height of mask members with respect to the substrate in the chamber to form encapsulation layers of various structures, since it is not necessary to individually prepare different mask members in consideration of different sizes and layer properties for each kind of encapsulation layer, the manufacturing cost of the mask member can be reduced, and the manufacturing structure and manufacturing process of the encapsulation layer can be simplified. Also, it is possible to form encapsulation layers of various structures.

Particularly, by differently setting the arrangement height of the mask members with respect to the substrate and thus adjusting the deposition area by the mask member, different structured encapsulation layers can be formed using a single kind of mask member.

Furthermore, since only one kind of mask member is used to form the encapsulation layers and thus only one kind of mask member enters and exits the chamber, the transferring and storing processes of the mask member can be further simplified.

In other words, encapsulation layers having different structures can be formed using a plurality of different mask members, but in this case, it is costly and time-consuming to manufacture and maintain a plurality of different mask members, respectively. In addition, since different mask members need to enter and exit the chamber according to the structures of the encapsulation layers and the mask members that have been used need to be stored in separate storage spaces in a predetermined order, the overall processing efficiency is complicated and reduced. However, since different mask members need not to enter and exit the chamber in a predetermined order and different mask members that have been used need not to be stored in separate spaces in a predetermined order by forming different structured encapsulation layers using one kind of mask member, the transferring and storing processing of the mask members can be simplified, and the time (time during which the deposition process stops) taken to dispose the mask members inside the chamber can be significantly shortened.

Also, since the deposition area by the mask pattern of the mask member can be increased by performing the deposition process of the encapsulation layer while the mask member is spaced from the upper surface of the substrate, that is, since the deposition can be performed in an area larger than the area of the mask pattern of the mask member, the encapsulation layer may be widely formed so as to cover not only the upper surface of the device but also the peripheral portion of the edge portion of the device. Accordingly, the edge portion of the encapsulation layer may be tapered so as to downwardly incline from the upper portion to the lower portion thereof. Thus, the moisture infiltration at the edge portion of the encapsulation layer can be blocked, and the yield reduction due to the moisture infiltration can be prevented. Also, the occurrence rate of dark spot can be reduced.

More specifically, the forming of the encapsulation layer may include: disposing the mask member at a first height with respect to the upper surface of the substrate; forming a first encapsulation layer using the mask member disposed at the first height; disposing the mask member at a second height different from the first height with respect to the substrate; and forming a second encapsulation layer covering the first encapsulation layer using the mask member disposed at the second height.

Thus, the object to be encapsulated can be more stably encapsulated by forming the second encapsulation layer together with the first encapsulation layer.

In this case, the mask member may be in close contact with the upper surface of the substrate, or may be spaced apart from the upper surface of the substrate at the first height. Also, the mask member may be spaced apart from the upper surface of the substrate at the second height.

The mask members may include the first mask member disposed at the first height and the second mask member disposed at the second height, and the first mask member and the second mask member may have the same mask pattern as each other.

Here, when the first mask member has the same mask pattern as the second mask member, the first mask member and the second mask member may be defined as having the same size and layer properties and having the mask patterns of the same size and shape. In one embodiment, as the first mask member and the second mask member, only one type of mask member that is standardized (or already established) may be used. In other words, one of two mask members equally formed so as to have the same standard as each other may be used as the first mask member, and the other may be used as the second mask member.

Alternately, the mask members may include the first mask member disposed at the first height and the second mask member disposed at the second height, and the second mask member may be the first mask member disposed at the second height. In other words, only one common mask member may be used as the first mask member and the second mask member. Here, when the common mask member is disposed at the first height, the common mask member may be used as the first mask member, and when the common mask member is disposed at the second height, the common mask member may be used as the second mask member.

In this case, the mask member may be spaced apart from the upper surface of the substrate at the second height.

The forming of the encapsulation layer may include adjusting the arrangement height of the mask member with respect to the substrate such that the deposition area by the mask member is adjusted.

Thus, in the adjusting of the arrangement height, since the arrangement height of the mask member with respect to the substrate can be adjusted while the deposition process is being performed by the mask member, it is possible to form the encapsulation layer formed of a single material into a multilayered structure (in which encapsulation layers having different deposition areas are successively laminated). Particularly, in this embodiment, since the encapsulation layer having a multi-layered structure can be formed using only one type of the first mask member, the manufacturing cost of the mask member can be reduced, and the manufacturing structure and manufacturing process of the encapsulation layer can be simplified. Also, it is possible to form encapsulation layers of various structures.

Preferably, in the adjusting of the arrangement height, by increasing the arrangement height of the mask member, more preferably, by gradually increasing the arrangement height of the mask member, the edge portion of the encapsulation layer may be tapered so as to downwardly incline from the upper portion to the lower portion thereof. In some embodiments, it is also possible to gradually reduce the arrangement height of the mask member while the encapsulation layer is being formed in the adjusting of the arrangement height.

In other embodiments of the present invention, substrate processing systems include: a chamber; a susceptor disposed inside the chamber and allowing a substrate to be seated thereon; a mask member disposed over the substrate; and a controller for controlling an arrangement height of the mask member with respect to the substrate, wherein an encapsulation layer covering a device formed on the substrate is formed using the mask member adjusted in height by the controller.

Thus, by allowing the controller to adjust the arrangement height of mask members with respect to the substrate in the chamber and thus to form encapsulation layers of various structures, since it is not necessary to individually prepare different mask members in consideration of different sizes and layer properties for each kind of encapsulation layer, the manufacturing cost of the mask member can be reduced, and the manufacturing structure and manufacturing process of the encapsulation layer can be simplified. Also, it is possible to form encapsulation layers of various structures.

More specifically, the controller may dispose the mask member at a first height with respect to the substrate, or may dispose the mask member at a second height different from the first height. In this case, when the mask member is disposed at the first height, the first encapsulation layer covering the device may be formed, and when the mask member is disposed at the second height, the second encapsulation layer covering the first encapsulation layer may be formed. Thus, the controller can more stably encapsulate the object to be encapsulated by disposing the mask members at different heights to form the first and second encapsulation layers.

In this case, the mask member may be in close contact with the upper surface of the substrate, or may be spaced apart from the upper surface of the substrate at the first height. Also, the mask member may be spaced apart from the upper surface of the substrate at the second height.

The mask members may include the first mask member disposed at the first height and the second mask member disposed at the second height, and the first mask member and the second mask member may have the same mask pattern as each other.

Here, when the first mask member has the same mask pattern as the second mask member, the first mask member and the second mask member may be defined as having the same size and layer properties and having the mask patterns of the same size and shape. In one embodiment, as the first mask member and the second mask member, only one type of mask member that is standardized (or already established) may be used. In other words, one of two mask members equally formed so as to have the same standard as each other may be used as the first mask member, and the other may be used as the second mask member.

Alternately, the mask members may include the first mask member disposed at the first height and the second mask member disposed at the second height, and the second mask member may be the first mask member disposed at the second height. In other words, only one common mask member may be used as the first mask member and the second mask member. Here, when the common mask member is disposed at the first height, the common mask member may be used as the first mask member, and when the common mask member is disposed at the second height, the common mask member may be used as the second mask member.

Also, the controller may control the deposition area through the mask member by adjusting the arrangement height of the mask member with respect to the substrate.

Thus, by adjusting the arrangement height of the mask member with respect to the substrate while the deposition process is being performed by the mask member, the controller can form the encapsulation layer formed of a single material into a multilayered structure (in which encapsulation layers having different deposition areas are successively laminated). Particularly, in this embodiment, since the encapsulation layer having a multi-layered structure can be formed using only one type of the first mask member, the manufacturing cost of the mask member can be reduced, and the manufacturing structure and manufacturing process of the encapsulation layer can be simplified. Also, it is possible to form encapsulation layers of various structures.

Preferably, by increasing the arrangement height of the mask member, more preferably, by gradually increasing the arrangement height of the mask member, the controller can allow the edge portion of the encapsulation layer to be tapered so as to downwardly incline from the upper portion to the lower portion thereof.

In still other embodiments of the present invention, substrate processing systems include: a first chamber; a first mask member disposed inside the first chamber and forming a first encapsulation layer so as to cover a device formed on an upper surface of a substrate in the first chamber; a second chamber disposed independently of the first chamber and forming a second encapsulation layer over the first encapsulation layer; a third chamber disposed independently of the second chamber; and a second mask member having the same mask pattern as the first mask member formed therein, disposed inside the third chamber, and forming a third encapsulation layer over the second encapsulation layer in the third chamber.

Thus, by forming a multilayer encapsulation thin layer including a plurality of encapsulation layers using one kind of mask members (first and second mask member) having the same mask pattern as each other, since it is not necessary to individually manufacture the plurality of mask members in consideration of different sizes and layer properties for each of the plurality of encapsulation layers, the manufacturing structure and manufacturing process of the multilayer encapsulation thin layer can be simplified, and the yield can be improved.

In some embodiments, the first mask member may be disposed at the first height with respect to the upper surface of the substrate inside the first chamber, and the second mask member may be disposed at the second height higher than the first height inside the third chamber. In this case, the first mask member may be in close contact with the upper surface of the substrate, or may be spaced apart from the upper surface of the substrate at the first height. Also, the second mask member may be in close contact with the upper surface of the substrate, or may be spaced apart from the upper surface of the substrate at the second height. Preferably, the first mask member may be in close contact with the upper surface of the substrate at the first height, and the second mask member may be spaced apart from the upper surface of the substrate at the second height at the second height.

Also, since the deposition area by the mask pattern of the second mask member can be increased by performing the deposition process of the third encapsulation layer while the second mask member is spaced from the upper surface of the substrate, the third encapsulation layer may be widely formed so as to cover not only the upper surface of the device but also the peripheral portion of the edge portion of the device. Accordingly, the edge portion of the multilayer encapsulation thin layer including a plurality of encapsulation layers may be tapered so as to downwardly incline from the upper portion to the lower portion thereof. Thus, the moisture infiltration at the edge portion of the multilayer encapsulation thin layer can be blocked, and the yield reduction due to the moisture infiltration can be prevented. Also, the occurrence rate of dark spot can be reduced.

The first encapsulation layer may be formed of an inorganic film, and the second encapsulation layer may be formed of an organic film. Also, the third encapsulation layer may be formed of an inorganic film. For reference, since the inorganic film is difficult to be formed to have a certain thickness or more, the second encapsulation layer formed of an organic film serving as a buffer layer needs to be formed between the first encapsulation layer and the third encapsulation layer. Thus, it is possible to extend the penetration time taken for oxygen and moisture to infiltrate into the encapsulation layer.

Also, the third chamber and the first chamber may use a single chamber in common (i.e., third chamber and first chamber are the same). In other words, the first chamber may be commonly used as the third chamber, and the third encapsulation layer may be formed on the upper surface of the substrate that returns to the first chamber after the second encapsulation layer is formed.

Thus, by using a single chamber as the first chamber and the third chamber in common and forming the first encapsulation layer and the third encapsulation layer in the single chamber, the equipment can be simplified, and the space necessary for installation of the equipment and the manufacturing cost can be reduced.

In even other embodiments of the present invention, substrate processing methods include: forming a first encapsulation layer so as to cover a device formed on an upper surface of a substrate using a first mask member inside a first chamber; forming a second encapsulation layer over the first encapsulation layer inside a second chamber; forming a third encapsulation layer over the second encapsulation layer inside a third chamber using a second mask member having the same mask pattern as the first mask member formed therein.

Preferably, by disposing the first mask member at the first height with respect to the substrate in the forming of the first encapsulation layer and disposing the second mask member at the second height higher than the first height, it is possible to adjust the deposition area of the encapsulation layer through the mask pattern of the mask member for each arrangement height of the mask member. Thus, different encapsulation layers can be formed using a single kind of mask member that is standardized.

In this case, the first mask member may be in close contact with the upper surface of the substrate, or may be spaced apart from the upper surface of the substrate at the first height. Also, the second mask member may be in close contact with the upper surface of the substrate, or may be spaced apart from the upper surface of the substrate at the second height. Preferably, the first mask member may be in close contact with the upper surface of the substrate at the first height, and the second mask member may be spaced apart from the upper surface of the substrate at the second height at the second height.

Also, since the deposition area by the mask pattern of the second mask member can be increased by performing the deposition process of the third encapsulation layer while the second mask member is spaced from the upper surface of the substrate, that is, since the deposition can be performed in an area larger than the area of the mask pattern of the second mask member, the third encapsulation layer may be widely formed so as to cover not only the upper surface of the device but also the peripheral portion of the edge portion of the device. Accordingly, the edge portion of the multilayer encapsulation thin layer including a plurality of encapsulation layers may be tapered so as to downwardly incline from the upper portion to the lower portion thereof. Thus, the moisture infiltration at the edge portion of the multilayer encapsulation thin layer can be blocked, and the yield reduction due to the moisture infiltration can be prevented. Also, the occurrence rate of dark spot can be reduced.

In the forming of the first encapsulation layer, the first encapsulation layer may be formed of an inorganic film, and in the forming of the second encapsulation layer, the second encapsulation layer may be formed of an organic film. Also, in the forming of the third encapsulation layer, the third encapsulation layer may be formed of an inorganic film. For reference, since the inorganic film is difficult to be formed to have a certain thickness or more, the second encapsulation layer formed of an organic film serving as a buffer layer needs to be formed between the first encapsulation layer and the third encapsulation layer. Thus, it is possible to extend the penetration time taken for oxygen and moisture to infiltrate into the encapsulation layer.

The third chamber used in the forming of the third encapsulation layer and the first chamber used in the forming of the first encapsulation layer may be independently provided as separate chambers. However, in some embodiments, the third chamber and the first chamber may use one chamber in common (third chamber=first chamber). In other words, the first chamber may be commonly used as the third chamber in the forming of the third encapsulation layer, and the third encapsulation layer may be formed on the upper surface of the substrate that returns to the first chamber after the second encapsulation layer is formed.

Thus, by using a single chamber as the first chamber and the third chamber in common and forming the first encapsulation layer and the third encapsulation layer in the single chamber, the equipment can be simplified, and the space necessary for installation of the equipment and the manufacturing cost can be reduced.

The term "standardized mask member" or similar terms thereto which are described in this disclosure may be defined as having the same mask pattern used to form a plurality of encapsulation layers and having the same shape and size as each other.

The term "multilayer encapsulation thin layer" or similar terms thereto which are described in this disclosure may be defined as a laminated layer formed by stacking at least two encapsulation layers.

Here, the term 'device formed on a substrate' or similar terms thereto which are described in this disclosure may denote an object that is formed on the upper surface of the substrate and is encapsulated by the multilayer encapsulation thin layer. For example, an Organic Light Emitting Diode (OLED) may be formed over the upper surface of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
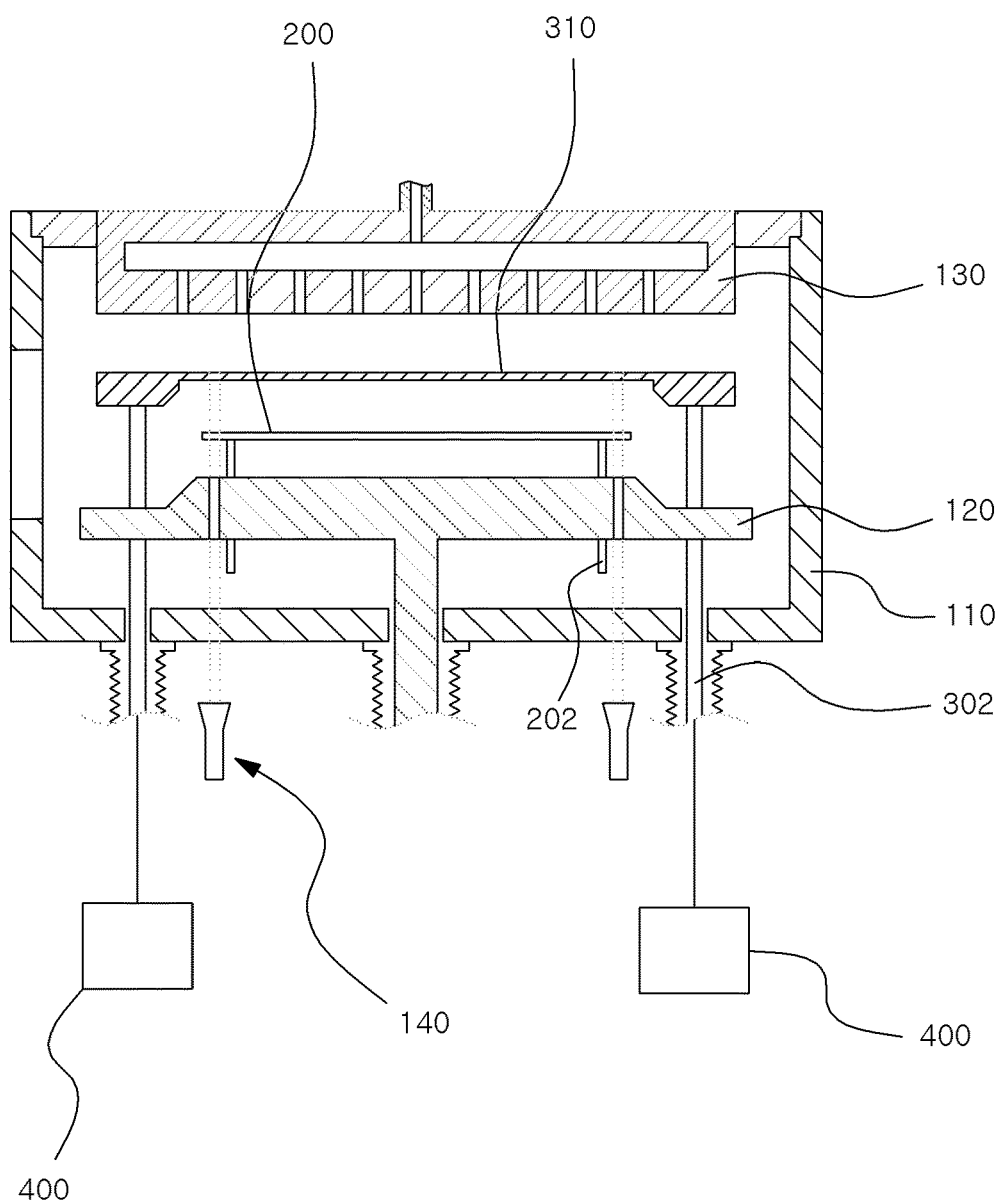
FIG. 1 is a view illustrating a first chamber of a substrate processing system according an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Referring to the accompanying drawing, a substrate processing system 10 according to an embodiment of the present invention may include a first chamber 110, a susceptor 120 which is disposed inside the first chamber 110 and on which a substrate 200 is seated, mask members 310 and 330 disposed over the substrate 200, and a controller 400 for controlling the height of the mask members 310 and 330 with respect to the substrate 200. Encapsulation layers 221 and 223 may be formed to cover a device 210 formed on the substrate 200 using the mask members 310 and 330, the height of which is adjusted by the controller 400.

The first chamber 110 may be provided with a vacuum processing space therein, and at least one side of the side wall may be provided with an entrance for allowing the substrate 200 and the first mask member 310 to enter and exit.

The size and structure of the first chamber 110 may be appropriately changed according to required conditions and design specifications, and the present invention is not limited by the characteristics of the first chamber 110.

A showerhead 130 may be disposed at an upper portion of the first chamber 110 to supply a process gas and RF energy into the first chamber 110.

The showerhead 130 may be provided in various structures according to required conditions and design specifications, and the present invention is not limited by the structure and characteristics of the showerhead 130. For example, the showerhead 130 may include a top plate, a mid plate, and an end plate which are disposed in a downward direction from the top, and the process gas supplied to a space between the top plate and the mid plate may be diffused between the mid plate and the end plate through a through hole of the mid plate and then may be sprayed to an inner space of the first chamber 110 through a discharge hole of the end plate.

The susceptor 120 may be provided in the first chamber 110 so as to be vertically movable along the vertical direction, and the substrate 200 may be disposed over the upper surface of the susceptor 120. The shaft of the susceptor 120 can be moved along the vertical direction by a typical drive unit such as a motor.

The first mask member 310 may be provided to form a first encapsulation layer 221 and to cover the device formed on the upper surface of the substrate 200 in the first chamber 110.

For reference, in this embodiment, the device 210 may denote an object which is formed on the upper surface of the substrate 200 and is encapsulated by the first encapsulation layer 221. For example, an Organic Light Emitting Diode (OLED) may be formed on the upper surface of the substrate 200. The first encapsulation layer 221 may cover the organic light emitting diode to prevent degradation in performance and lifespan due to exposure of the OLED to oxygen and moisture in the air.

The material and characteristics of the first encapsulation layer 221 formed by the first mask member 310 may be variously changed in accordance with the required conditions and design specifications. Preferably, the first encapsulation layer 221 may be formed of an inorganic film material that can effectively prevent penetration of oxygen and moisture.

A mask pattern 312 for forming an encapsulation layer may be formed in the first mask member 310, and a first encapsulation layer 221 may be formed through deposition on the region of the mask pattern 312. In one embodiment, the first mask member may include a mask plate and a mask sheet attached to the mask plate, and the mask pattern may be formed on the mask sheet. In some embodiments, the mask pattern may be directly formed on the mask plate without a separate mask sheet.

The controller 400 may control the arrangement height of the mask members 310 and 330 with respect to the substrate 200 such that the encapsulation layers 221 and 223 covering the device 210 formed on the substrate 200 can be formed in various structures.

In other words, the controller 400 may control the arrangement height of the mask members 310 and 330 with respect to the substrate 200 such that the deposition area by the mask members 310 and 330 is adjusted, and thus the encapsulation layers 221 and 223 having different structures can be formed.

In addition, in this embodiment, by forming the first encapsulation layer 221 using the first mask member 310 spaced apart from the upper surface of the substrate 200 by a first height H1, it is possible to form an encapsulation layer having various structures using only one type of first mask member 310.

That is, in order to vary the structure of the encapsulation layer (e.g., the deposition area of the encapsulation layer), it may be necessary to form encapsulation layers having different deposition areas using separate mask members for each required deposition area. However, even though only one type of first mask member 310 is used in this embodiment, encapsulation layers of different structures (different deposition areas) can be formed by adjusting the first height H1 of the first mask member 310 with respect to the substrate 200.

For example, when the distance (first height) between the substrate 200 and the first mask member 310 increases (when the arrangement height of the first mask member with respect to the substrate increases), the deposition area of the first encapsulation layer 221 deposited by the mask pattern 312 can be increased (widely deposited). On the contrary, when the distance between the substrate 200 and the first mask member 310 decreases, the deposition area of the first encapsulation layer 221 deposited by the mask pattern 312 of the first mask member 310 can be reduced.

In this case, the arrangement height (first height) of the first mask member 310 with respect to the substrate 200 may be variously changed in accordance with the required conditions and the deposition environment, and the present invention is not limited by the first height H1. In this case, the first mask member 310 may be adhered closely to or spaced from the upper surface of the substrate 200 at the first height H1.

Figure 5:
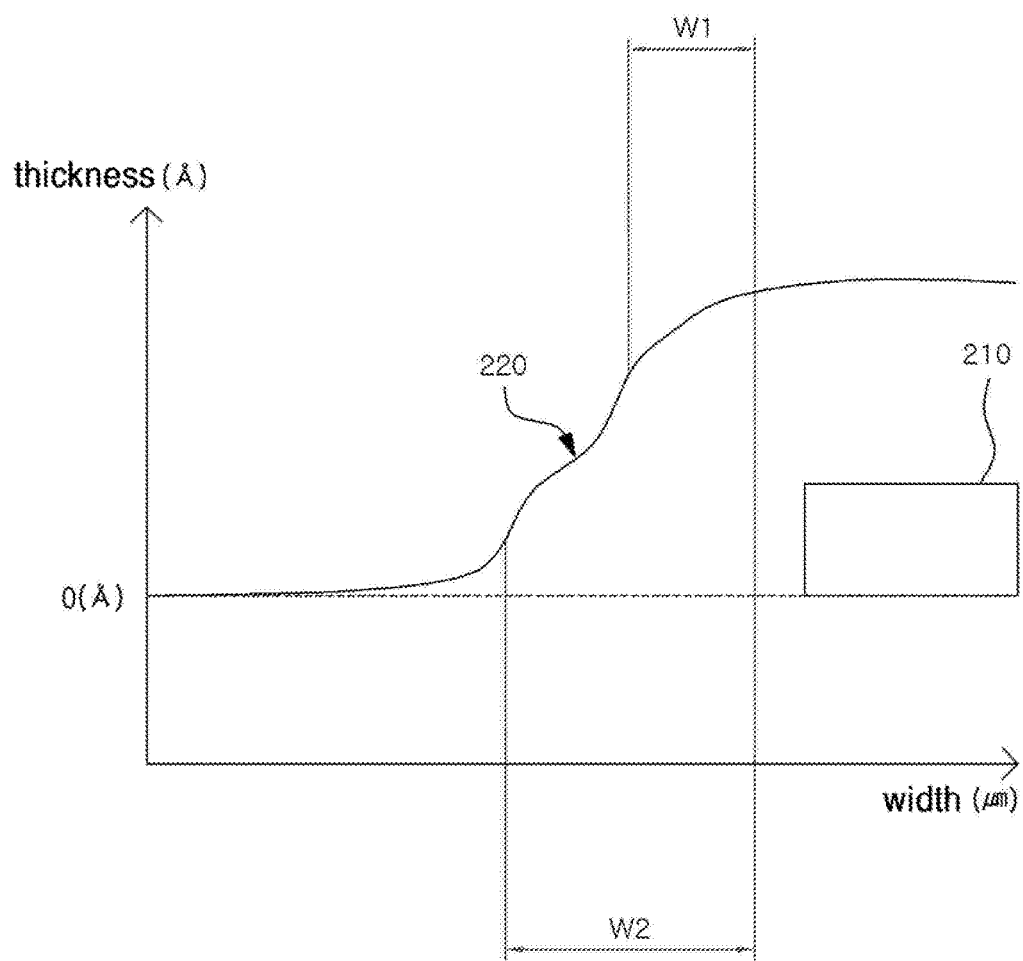
FIG. 5 is a graph illustrating the thickness distribution of an encapsulation layer formed by the substrate processing system of FIG. 1.

Also, by forming the first encapsulation layer 221 while the first mask member 310 is spaced apart from the substrate 200, the edge portion of the first encapsulation layer 221 may be tapered so as to downwardly incline from the upper portion to the lower portion thereof. In other words, the edge portion of the first encapsulation layer 221 may be tapered to have a wider width (see W1<W2 in FIG. 5) from the upper portion to the lower portion thereof.

That is, since the deposition area by the mask pattern 312 of the first mask member 310 can be increased by allowing the first mask member 310 to be spaced apart from the upper surface of the substrate 200, that is, since the deposition can be performed in an area larger than the area of the mask pattern 312 of the first mask member 310, the first encapsulation layer 221 may be widely formed so as to cover not only the upper surface of the device 210 but also the peripheral portion of the edge portion of the device 210.

If the edge portion of the first encapsulation layer 221 is vertically formed (a rectangular structure in which the widths of the upper and lower portion of the edge portion are equal to each other), moisture may easily penetrate through the edge portion of the first encapsulation layer 221, and thus the yield may be significantly reduced. Also, the incidence of dark spots (or block spots) may increase. On the other hand, when the edge portion of the first encapsulation layer 221 is tapered like this embodiment, the moisture infiltration at the edge portion of the first encapsulation layer 221 can be blocked. Accordingly, the yield reduction according to the moisture infiltration can be prevented, and the occurrence rate of dark spot can also be reduced.

On the other hand, the substrate processing system 10 may include an alignment unit 140 for performing alignment of the first mask member 310 (or alignment of the substrate with respect to the mask member) with respect to the substrate 200 before the encapsulation layer 220 is formed.

The alignment unit 140 may align the first mask member 310 with respect to the substrate 200 after the first mask member 310 enters the first chamber 110. For reference, the alignment unit 140 may perform the alignment process of the first mask member 310 with respect to the substrate 200 only once after the substrate 200 enters the first chamber 110. However, in some embodiments, it is also possible to carry out the alignment process twice or more.

In one embodiment, the alignment unit 140 may include a photographing unit and a mask member moving unit. The photographing unit may photographs a target mark (or an object mark) formed on the substrate 200 and an object mark (or a target mark) formed on the first mask member 310. The mask member moving unit may move the first mask member 310 by a distance and a direction error between the target mark and the object mark which are photographed by the photographing unit. In some embodiments, the alignment unit may be provided with other structures capable of aligning the mask member with respect to the substrate, and the present invention is not limited by the structure of the alignment unit.

The photographing unit may be provided to photograph the target mark and the object mark. In one embodiment, a typical camera such as a vision camera may be used as the photographing unit.

The mask member moving unit may be configured to move the mask member support 302, which supports the undersurface of the first mask member 310, in three axis directions (e.g., X axis, Y axis, Z axis or R axis, θ Axis, Z axis) by a typical drive unit.

On the other hand, the encapsulation layer (see 220 in FIG. 4) formed so as to cover the device may be configured with only a single film (e.g., the first encapsulation layer). However, alternatively, the encapsulation layer may also be configured with a plurality of multi-layers (e.g., a first encapsulation layer, a second encapsulation layer, and a third encapsulation layer).

Figure 3:
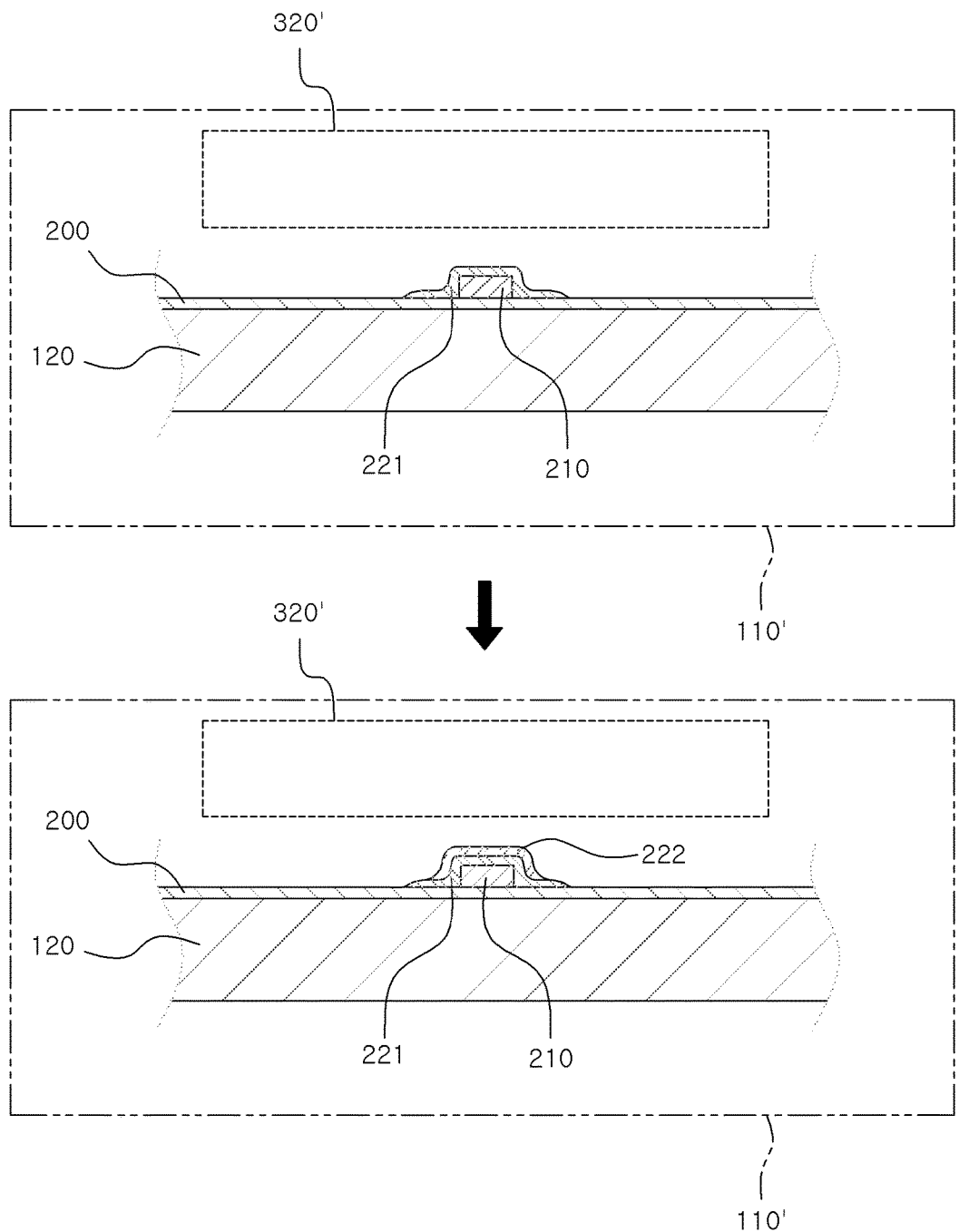
FIG. 3 is a view illustrating a process of forming a second encapsulation layer over the first encapsulation layer of FIG. 2.

Referring to FIG. 3, a third encapsulation layer 223 may be formed over the substrate 200 on which the first encapsulation layer 221 is formed. In one embodiment, the substrate 200 may be transferred to a second chamber 110' after passing through the first chamber 110, and the second encapsulation layer 222 may be formed over the upper surface of the substrate 200 (the upper surface of the first encapsulation layer 221) in the second chamber 110'. Preferably, the second encapsulation layer 222 may be formed of an organic film, and may be formed so as to partially or wholly cover the upper surface of the first encapsulation layer 221.

A unit for forming the second encapsulation layer 222 on the upper surface of the first encapsulation layer 221 may be disposed in the second chamber 110', and various encapsulation layer forming units may be used as the unit for forming the second encapsulation layer 222 according to the conditions and the design specifications.

Preferably, as the unit for forming the second encapsulation layer 222, an inkjet printer 320' for inkjet-printing the second encapsulation layer 222 may be provided in the second chamber 110'. Thus, by forming the second encapsulation layer 222 using the inkjet printer 320' in the second chamber 110', it is possible to simplify the structure and shorten the process of forming the second encapsulation layer 222. In particular, since the inkjet printer 320' can form the second encapsulation layer 222 in an atmospheric pressure state and the working process is very simple and quick, the yield can be improved. In some embodiments, it is also possible to deposit the second encapsulation layer in a vacuum state inside the second chamber. Alternatively, the device may also be encapsulated only with the first encapsulation layer without forming a separate second encapsulation layer.

Figure 4:
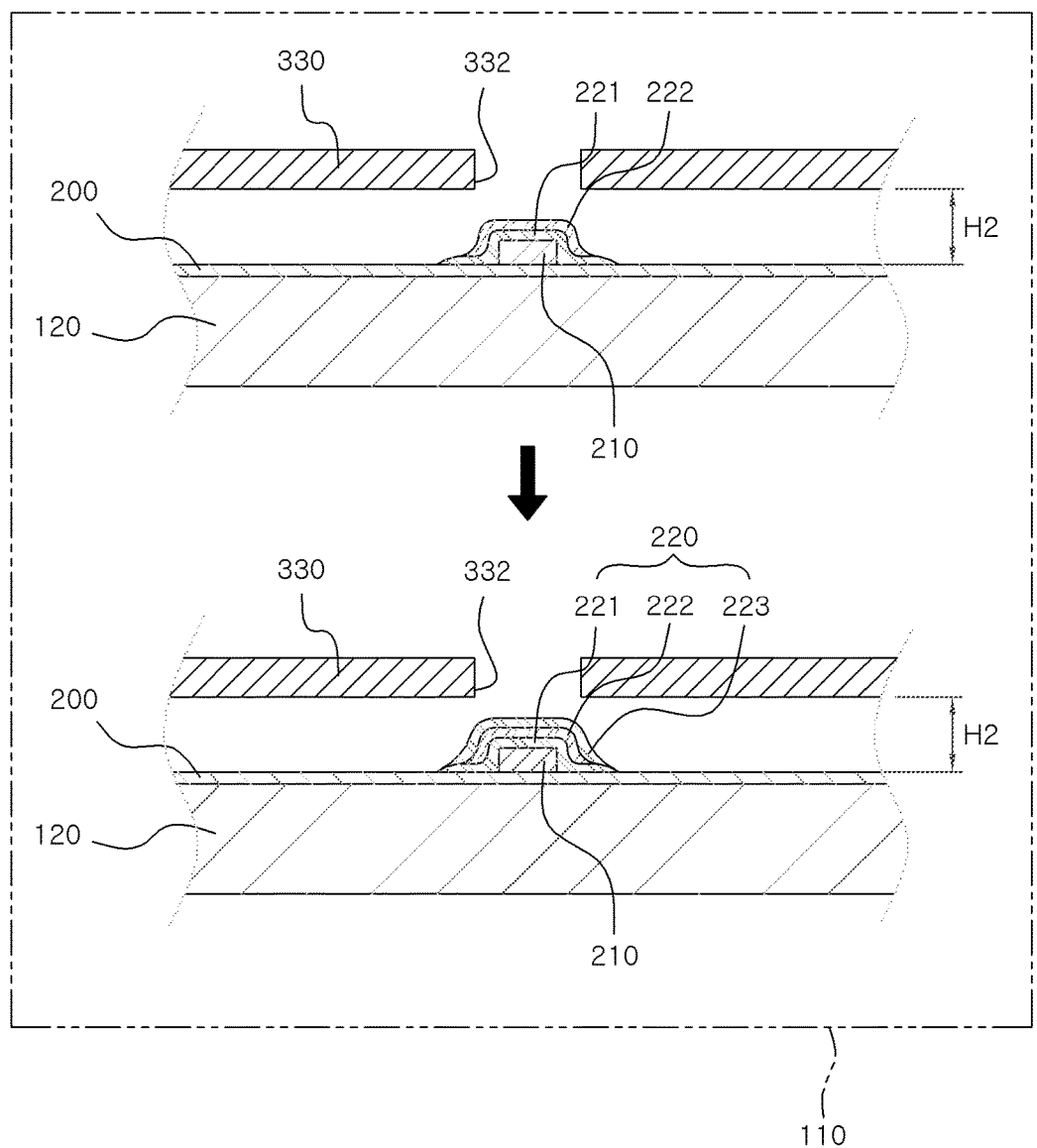
FIG. 4 is a view illustrating a process of forming a third encapsulation layer by the substrate processing system of FIG. 1.

Referring to FIG. 4, the substrate processing system according an embodiment of the present invention may include a second mask member 330 disposed at a second height H2 different from the first height H1 with respect to the substrate 200. Also, a third encapsulation layer 223 covering the device may be formed by the second mask member 330. Preferably, the third encapsulation layer 223 may be formed of an inorganic film, and may be formed so as to wholly cover the upper surface of the second encapsulation layer 222.

The same mask pattern 332 as the first mask member 310 may be formed in the second mask member 330, and may be provided to form the third encapsulation layer 223 in the first chamber 110 in which the first encapsulation layer 221 is formed.

Here, when the second mask member 330 has the same mask pattern 332 as the first mask member 310, the first mask member 310 and the second mask member 330 may be defined as having the same size and layer properties and having the mask patterns 312 and 332 of the same size and shape. In other words, it is understood that only one kind of mask member that is standardized (or already established) as the first mask member 310 and the second mask member 330 is used.

In one embodiment, as the first mask member 310 and the second mask member 330, only one type of mask member that is standardized (or already established) may be used. In other words, one of two mask members equally formed so as to have the same standard as each other may be used as the first mask member 310, and the other may be used as the second mask member 330.

In another embodiment, the second mask member 330 may be the first mask member 310 disposed at the second height. In other words, only one common mask member may be used as the first mask member 310 and the second mask member 330. Here, when the common mask member is disposed at the first height H1, the common mask member may be used as the first mask member 310, and when the common mask member is disposed at the second height H2, the common mask member may be used as the second mask member 330.

The second mask member 330 may be in close contact with the upper surface of the substrate 200 at the second height, or may be spaced apart from the upper surface of the substrate 200. Hereinafter, the second mask member 330 will be described as spaced apart from the upper surface of the substrate 200 at the second height H2, and the second height H2 will be described as greater than the first height H1 (H2>H1). In some embodiments, the second mask member may be disposed at a second height lower than the first height.

In addition, the first encapsulation layer 221 may be formed of an inorganic film, and the second encapsulation layer 222 may be formed of an organic film. Also, the third encapsulation layer 223 may be formed of an inorganic film. For reference, since the inorganic film is difficult to be formed to have a certain thickness or more, the second encapsulation layer 222 formed of an organic film serving as a buffer layer needs to be formed between the first encapsulation layer 221 and the third encapsulation layer 223. Thus, it is possible to extend the penetration time taken for oxygen and moisture to infiltrate into the encapsulation layer 220 including the first encapsulation layer 221, the second encapsulation layer 222 and the third encapsulation layer 223. In some embodiments, the third encapsulation layer may be formed of a material other than the inorganic film.

Also, by forming the third encapsulation layer 223 while the second mask member 330 is spaced apart from the substrate 200 by the second height, the edge portion of the third encapsulation layer 223 may be tapered so as to downwardly incline from the upper portion to the lower portion thereof. In other words, the edge portion of the third encapsulation layer 223 may be tapered to have a wider width (see W1<W2) from the upper portion to the lower portion thereof.

That is, since the deposition area by the mask pattern 332 of the second mask member 330 can be increased by allowing the second mask member 330 to be spaced apart from the upper surface of the substrate 200, that is, since the deposition can be performed in an area larger than the area of the mask pattern 332 of the second mask member 330, the third encapsulation layer 223 may be widely formed so as to cover not only the upper surface of the device 210 but also the peripheral portion of the edge portion of the device 210.

Accordingly, since the moisture infiltration at the edge portion of the third encapsulation layer 223 can be blocked, the yield reduction due to the moisture infiltration can be prevented, and the occurrence rate of dark spot can be reduced.

Figure 2:
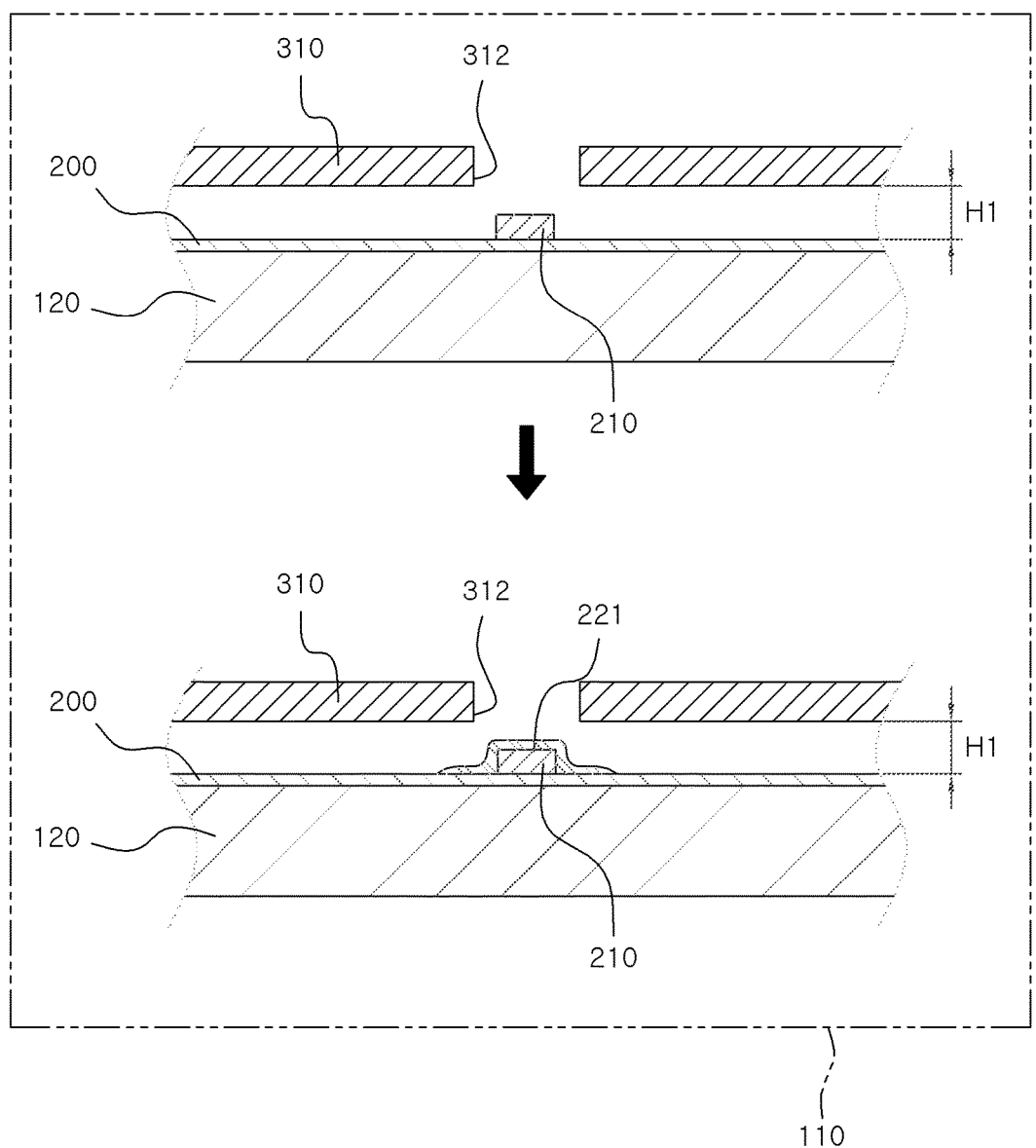
FIG. 2 is a view illustrating a process of forming a first encapsulation layer by the substrate processing system of FIG. 1.
Figure 6:
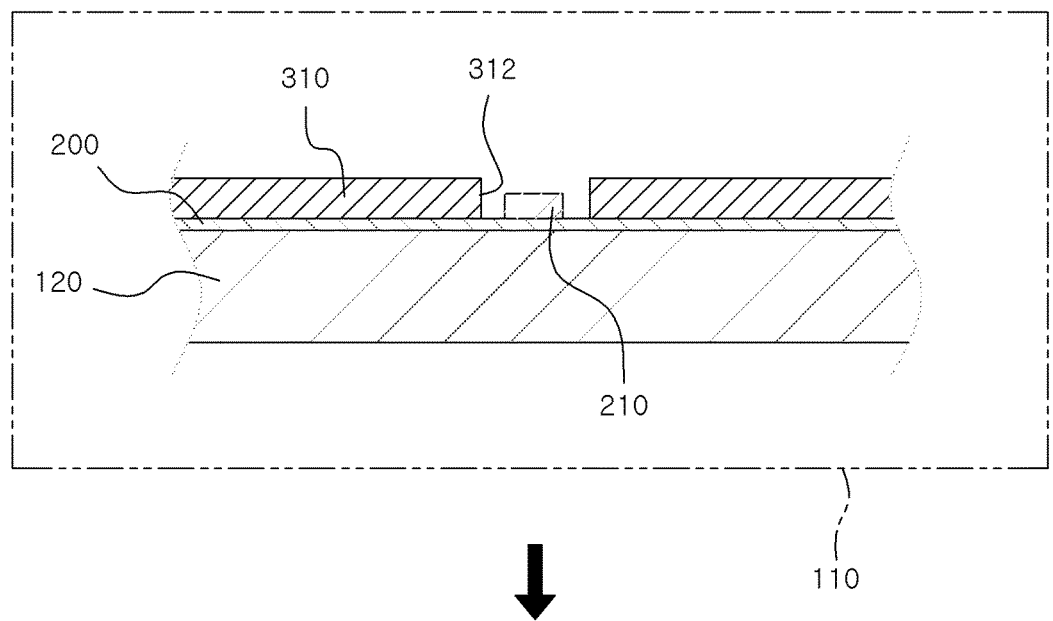
FIGS. 6 to 9 are views illustrating another exemplary process of forming an encapsulation layer by the substrate processing system of FIG. 1.
Figure 6:
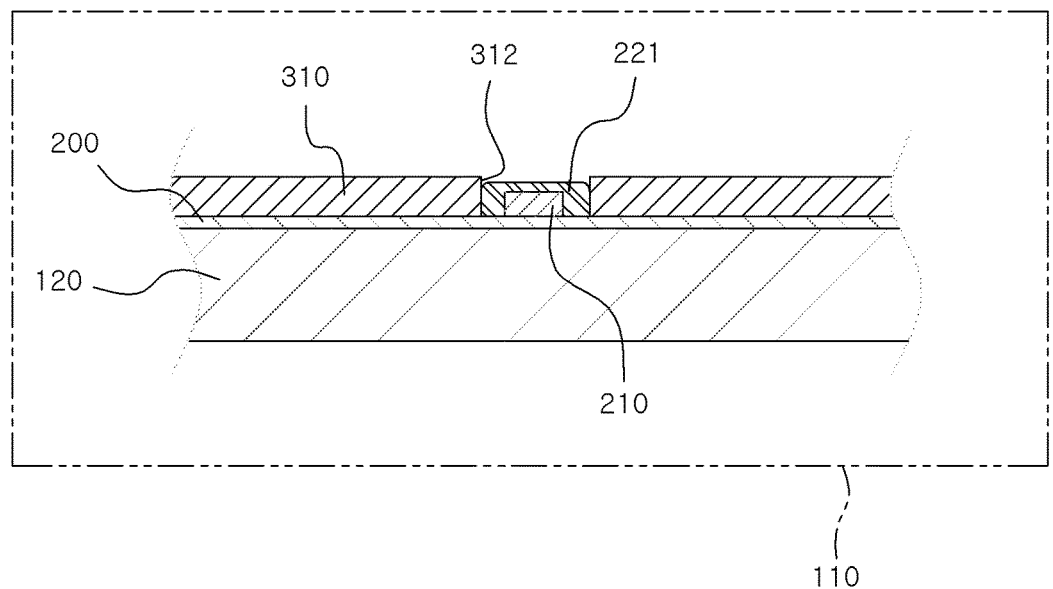
Figure 7:
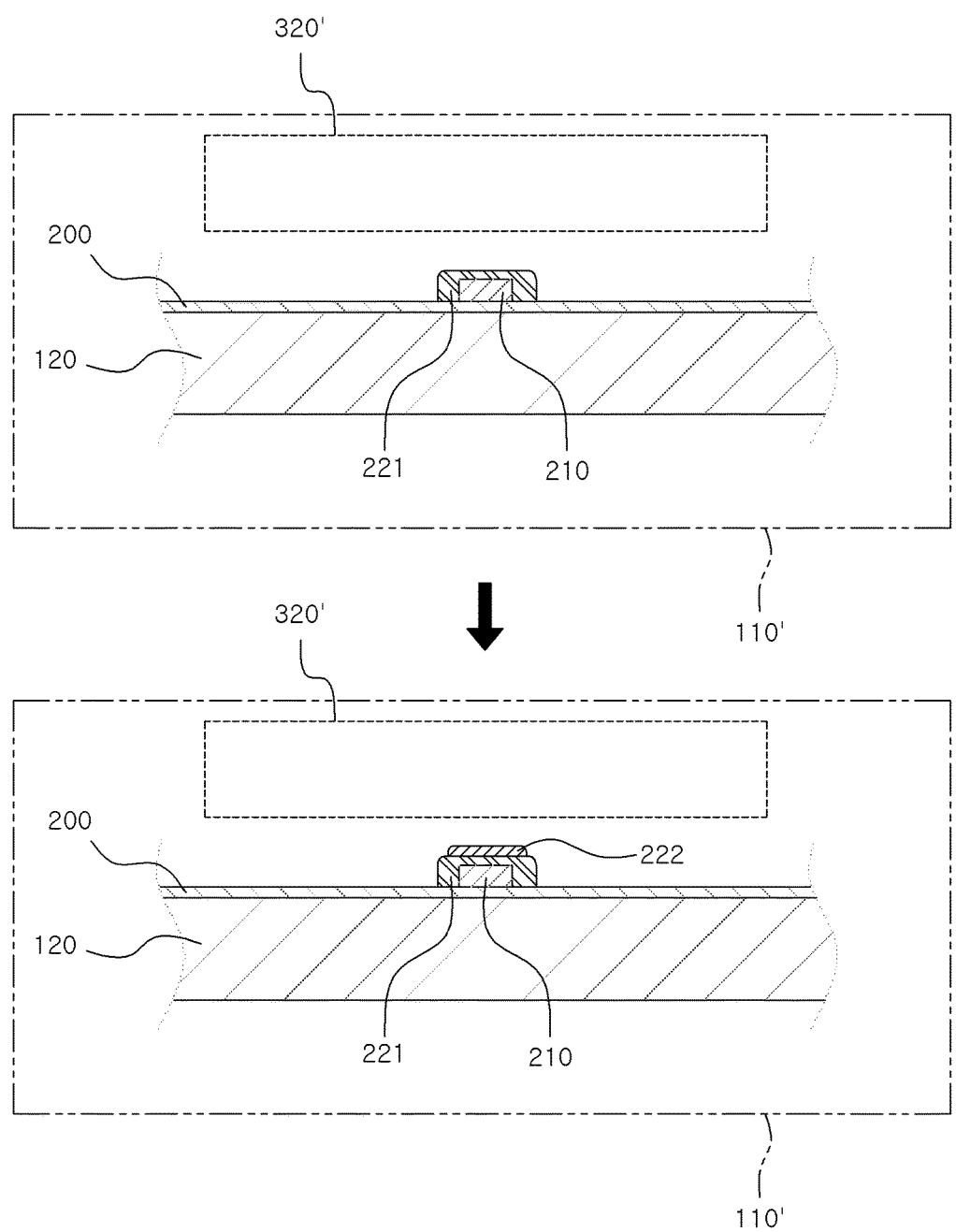
Figure 8:
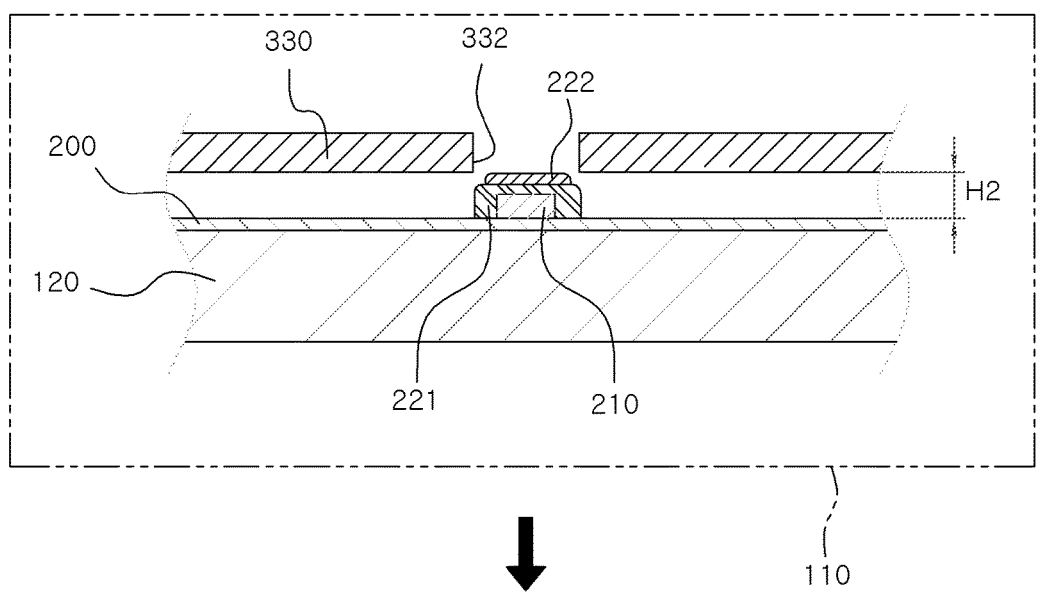
Figure 8:
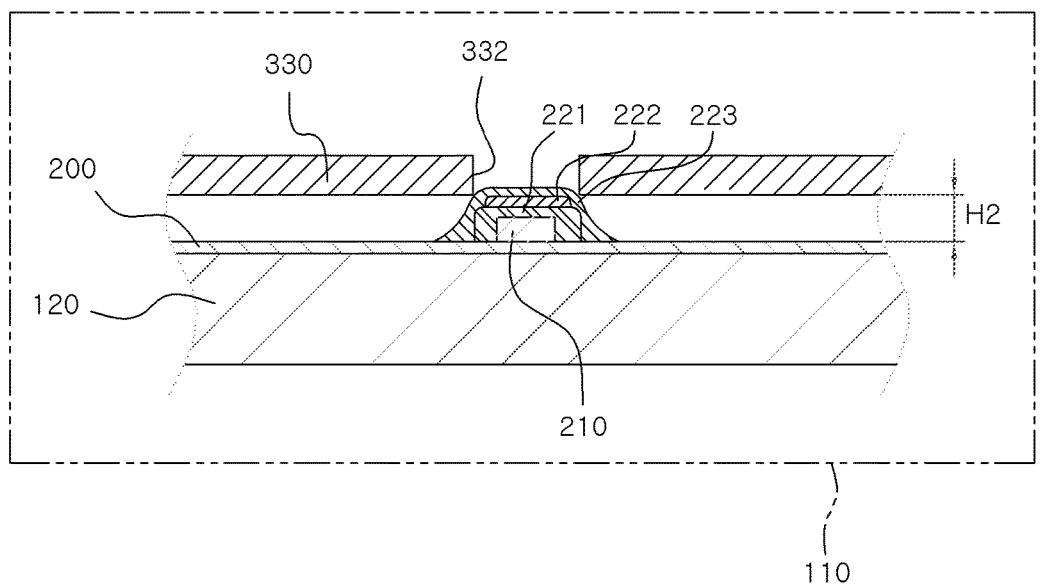

On the other hand, in FIGS. 2 to 4, it has been described that the first encapsulation layer 221 is first formed while the first mask member 310 is being spaced from the substrate 200 and then the third encapsulation layer 223 is formed while the second mask member 330 is being spaced from the substrate 200. However, as shown in FIGS. 6 and 8, the first encapsulation layer 221 may also be first formed while the first mask member 310 is in close contact with the substrate 200, and then the third encapsulation layer 223 may be formed while the second mask member 330 is being spaced from the substrate 200. Also, as shown in FIG. 7, the second encapsulation layer 222 may be formed between the third encapsulation layer 223 and the first encapsulation layer 221.

Figure 9:
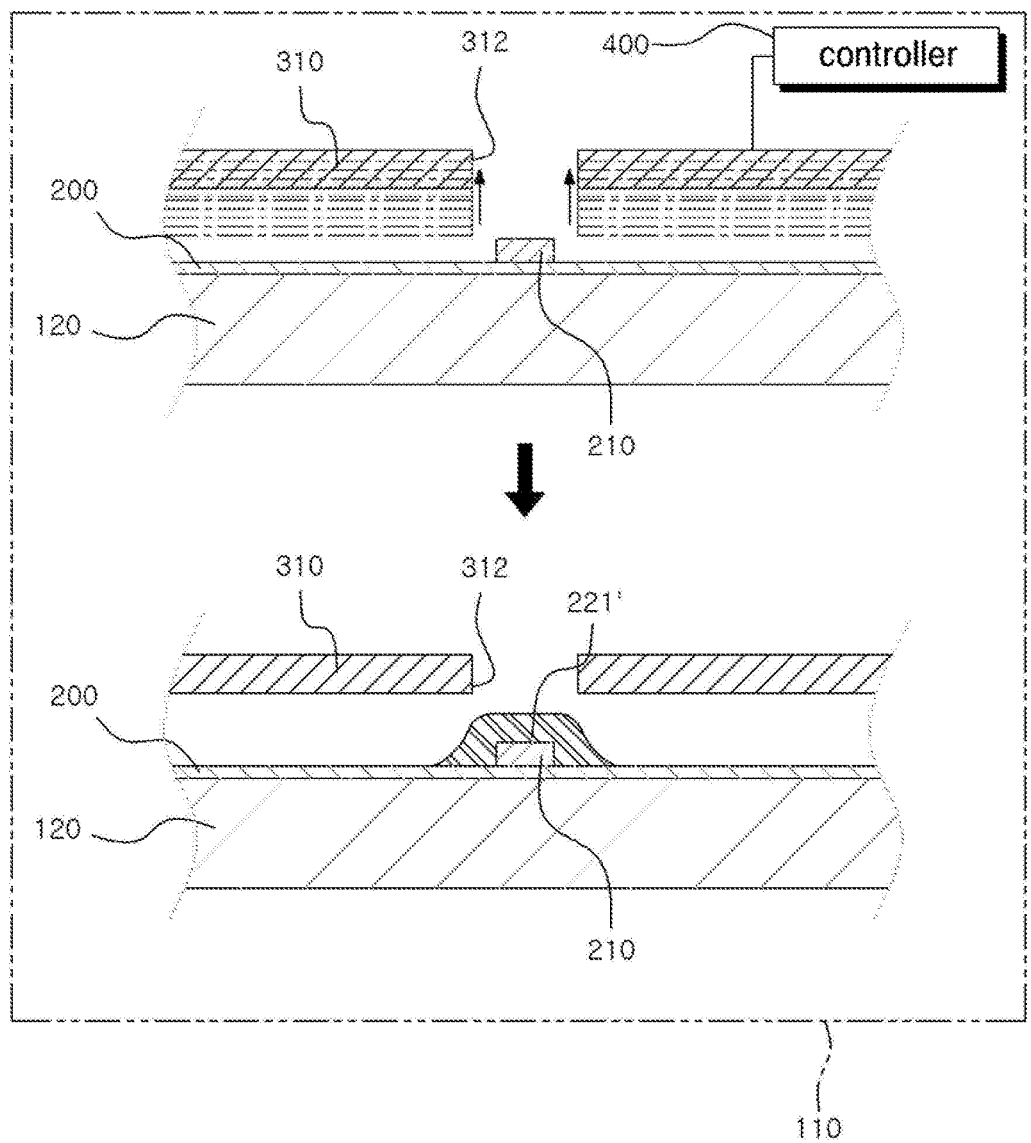

Referring to FIG. 9, a substrate processing system 10 according to another embodiment of the present invention may include a first chamber 110, a susceptor 120 which is disposed inside the first chamber 110 and on which a substrate 200 is seated, a first mask member 310 disposed over the substrate 200, and a controller 400 for controlling the height of the first mask members with respect to the substrate 200 such that the deposition area by the first mask member 310 is adjusted while a first encapsulation layer 221' is being formed.

Here, the period during which the first encapsulation layer 221' is formed may be defined as a process in which a process gas is being supplied into the first chamber 110 and the deposition process by the first mask member 310 is being performed.

The controller 400 may adjust the height of the first mask member 310 with respect to the substrate 200 while the deposition process is being performed by the first mask member 310. Thus, the controller 400 can continuously adjust the deposition area of the first encapsulation layer 221' by the first mask member 310.

Thus, since the height of the first mask member 310 with respect to the substrate 200 can be adjusted while the deposition process is being performed by the first mask member 310, it is possible to form the first encapsulation layer 221' formed of a single material into a multilayered structure (in which encapsulation layers having different deposition areas are successively laminated) Particularly, since a typical encapsulation layer is formed by one mask member which is fixedly disposed, only one encapsulation layer of a single-layered structure can be formed by one mask member. In order to form an encapsulation layer of a multi-layered structure, since various kinds of mask members having different mask pattern formed therein need to be used, there is a limitation that the manufacturing process is complicated and the manufacturing time and cost are increased. However, in this embodiment, since the first encapsulation layer 221' having a multi-layered structure can be formed using only one type of the first mask member 310, the manufacturing cost of the mask member can be reduced, and the manufacturing structure and manufacturing process of the encapsulation layer can be simplified. Also, it is possible to form encapsulation layers of various structures.

The controller 400 may gradually increase the arrangement height of the first mask member 310 while the first encapsulation layer 221' is being formed, thereby allowing the edge portion of the first encapsulation layer 221' to be tapered so as to downwardly incline from the upper portion to the lower portion thereof. In some embodiments, the controller may gradually decrease the arrangement height of the first mask member while the first encapsulation layer is being formed.

On the other hand, a substrate processing system 10 according to another embodiment of the present invention may include a first chamber 110, a first mask member 310, a second chamber 110', a third chamber 110", and a second mask member 330. The first mask member 310 may be disposed inside the first chamber 110, and may form a first encapsulation layer 221 so as to cover a device 210 formed on the upper surface of substrate 200 in the first chamber 110. The second chamber 110' may be disposed independently of the first chamber 110. In the second chamber 110', a second encapsulation layer 222 may be formed over the upper surface of the first encapsulation layer 221. The third chamber 110" may be disposed independently of the second chamber 110'. The second mask member 330 may have the same mask pattern 332 as the first mask member 310 formed therein, and may be disposed inside the third chamber 110". The second mask member 330 may form a third encapsulation layer 223 over the upper surface of the second 222 in the third chamber 110".

That is, another embodiment of the present invention is characterized in that the third chamber 110" is provided independently of the first chamber 110 and the second chamber 110'. Here, since the third chamber 110' are configured to be the same as or similar to the first chamber 110 described above, detailed descriptions of the configuration of the first chamber 110 and the third chamber 110" will be omitted.

The first mask member 310 may be disposed inside the first chamber 110, and may be provided to form the first encapsulation layer 221 covering the device formed on the upper surface of the substrate in the first chamber 110.

The arrangement height of the first mask member 310 with respect to the substrate 200 can be adjusted by a height adjusting unit 320. For example, the first mask member 310 may be disposed at a first height with respect to the upper surface of the substrate 200 inside the first chamber 110 by the height adjusting unit 320. In this case, the first mask member 310 may be in close contact with the upper surface of the substrate 200 at the first height, or may be spaced apart from the upper surface of the substrate 200. Hereinafter, the case where the first mask member 310 is in close contact with the upper surface of the substrate 200 at the first height will be exemplified.

Also, a first alignment unit 140 may be provided inside the first chamber 110 performing the alignment of the first mask member 310 with respect to the substrate 200 (or the alignment of the substrate with respect to the first mask member) before the first encapsulation layer 221 is formed.

Referring to FIG. 7, the second chamber 110' may be provided independently of the first chamber 110, and the second encapsulation layer 221 may be formed over the upper surface of the first encapsulation layer 221 in the second chamber 110'.

The substrate may be transferred to a second chamber 110' after passing through the first chamber 110, and the second encapsulation layer 222 may be formed over the upper surface of the substrate, i.e., the upper surface of the first encapsulation layer 221 in the second chamber 110'. Preferably, the second encapsulation layer 222 may be formed of an organic film, and may be formed so as to partially cover the upper surface of the first encapsulation layer 221.

A second encapsulation layer forming unit for forming the second encapsulation layer 222 on the upper surface of the first encapsulation layer 221 may be disposed in the second chamber 110', and various encapsulation layer forming units may be used as the second encapsulation layer forming unit according to the conditions and the design specifications.

Preferably, as the second encapsulation layer forming unit, an inkjet printer 320 for inkjet-printing the second encapsulation layer 222 may be provided in the second chamber 110'. Thus, by forming the second encapsulation layer 222 using the inkjet printer 320 in the second chamber 110', it is possible to simplify the structure and shorten the process of forming the second encapsulation layer 222. In particular, since the inkjet printer 320 can form the second encapsulation layer 222 in an atmospheric pressure state and the working process is very simple and quick, the yield can be improved. In some embodiments, it is also possible to deposit the second encapsulation layer in a vacuum state inside the second chamber.

Figure 10:
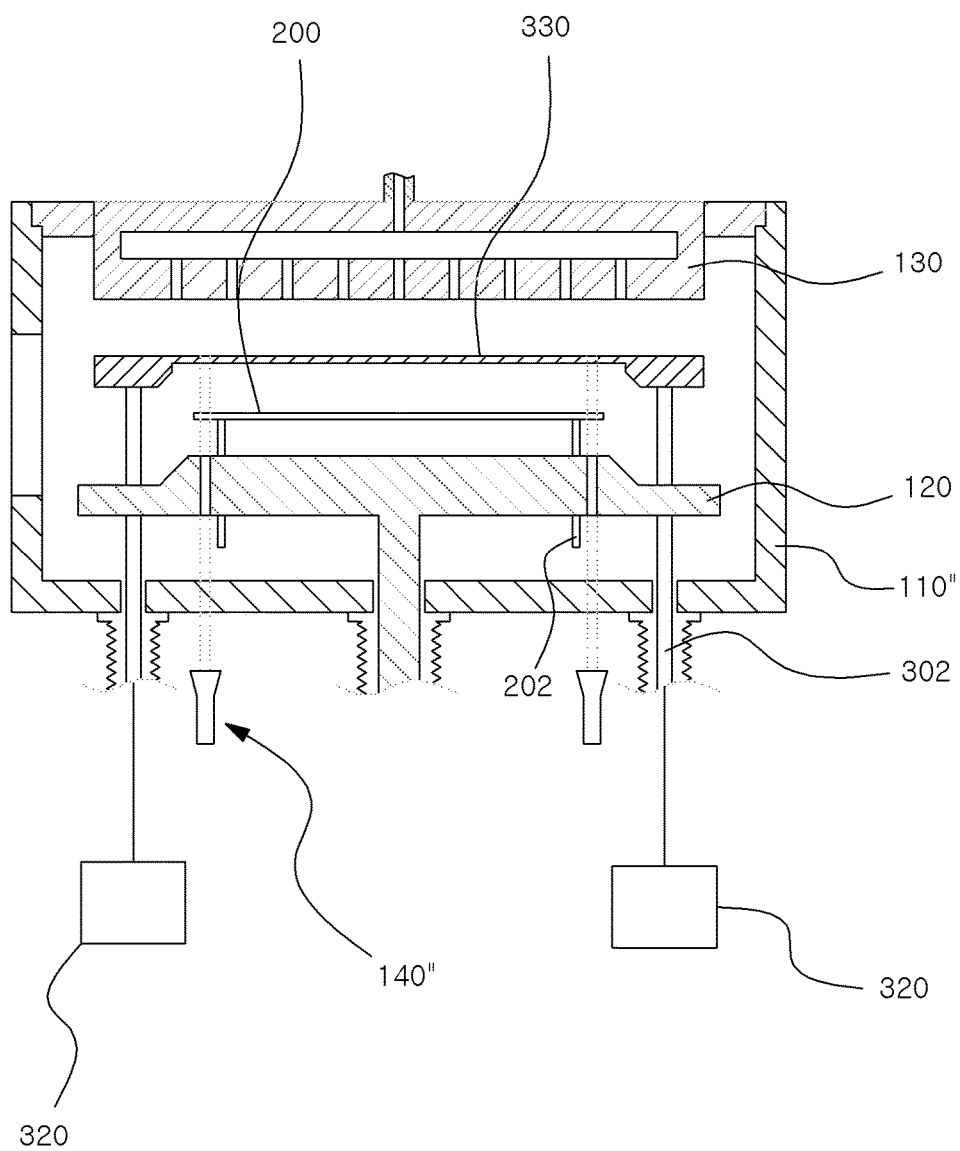
FIG. 10 is a view illustrating a third chamber of the substrate processing system of FIG. 1.
Figure 11:
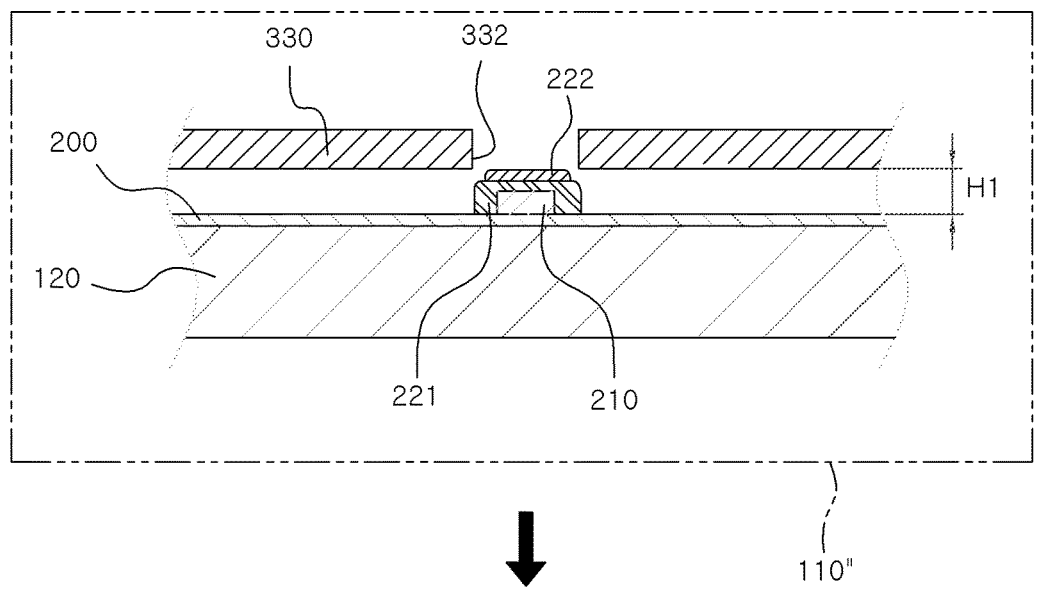
FIG. 11 is a view illustrating a process of forming a third encapsulation layer by the third chamber of FIG. 10.
Figure 11:
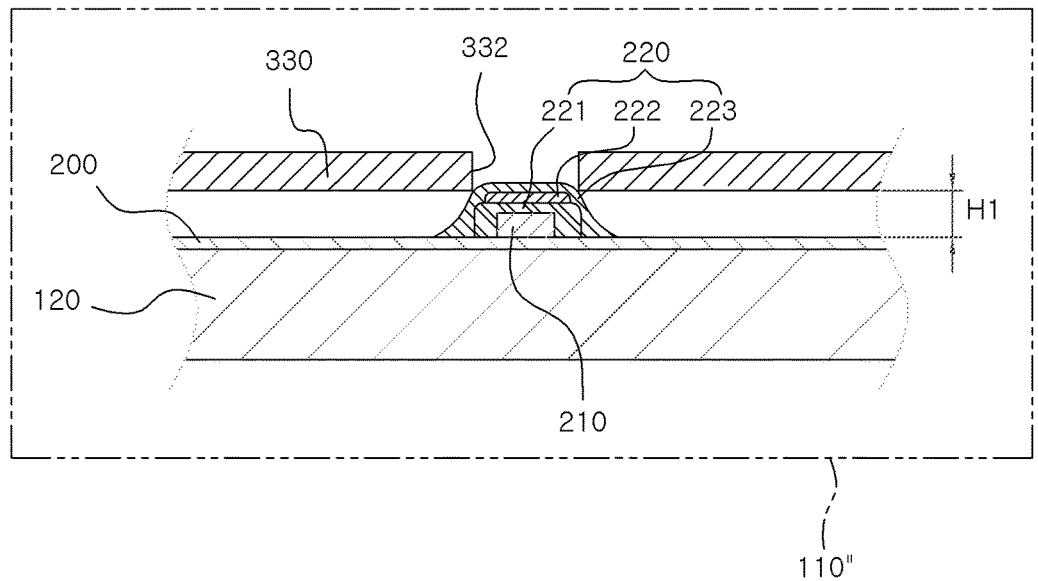

Referring to FIGS. 10 and 11, the third chamber 110" may be provided with a vacuum processing space therein, and at least one side of the side wall may be provided with an entrance for allowing the substrate 200 and the second mask member 330 to enter and exit.

The size and structure of the third chamber 110" may be appropriately changed according to required conditions and design specifications, and the present invention is not limited by the characteristics of the third chamber 110".

A showerhead 130 may be disposed at an upper portion of the third chamber 110" to supply a process gas and RF energy into the third chamber 110".

The showerhead 130 may be provided in various structures according to required conditions and design specifications, and the present invention is not limited by the structure and characteristics of the showerhead 130.

A susceptor 120 may be provided in the third chamber 110" so as to be vertically movable along the vertical direction, and the substrate 200 may be disposed over the upper surface of the susceptor 120. The shaft of the susceptor 120 can be moved along the vertical direction by a typical drive unit such as a motor.

The third chamber 110" and the first chamber 110 may be independently provided as separate chambers. However, in some embodiments, the third chamber 110" and the first chamber 110 may use one chamber in common (third chamber=first chamber).

In other words, the first chamber 110 may be commonly used as the third chamber 110", and the third encapsulation layer 223 may be formed on the upper surface of the substrate 200 that returns to the first chamber 110 after the second encapsulation layer 222 is formed.

Here, returning of the substrate 200 to the first chamber 110 may mean that the substrate 200 returns to the first chamber (serving as the third chamber) after passing through the first chamber 110 and the second chamber 110'.

Thus, by using a single chamber as the first chamber 110 and the third chamber 110" in common, the equipment can be simplified, and the space necessary for installation of the equipment and the manufacturing cost can be reduced.

The same mask pattern 332 as the first mask member 310 may be formed in the second mask member 330. The second mask member 330 may be disposed inside the third chamber 110", and may be provided to form the third encapsulation layer 223 covering the second encapsulation layer 222 in the third chamber 110".

Here, when the second mask member 330 has the same mask pattern 332 as the first mask member 310, the first mask member 310 and the second mask member 330 may be defined as having the same size and layer properties and having the mask patterns 312 and 332 of the same size and shape. In other words, it is understood that only one kind of mask member that is standardized (or already established) as the first mask member 310 and the second mask member 330 is used.

The mask pattern 332 for forming the third encapsulation layer 223 may be formed in the second mask member 330, and the third encapsulation layer 223 may be formed through deposition on the region of the mask pattern 332. In one embodiment, the second mask member 330 may include a mask plate and a mask sheet attached to the mask plate, and the mask pattern may be formed on the mask sheet. In some embodiments, the mask pattern may be directly formed on the mask plate without a separate mask sheet.

The arrangement height of the second mask member 330 with respect to the substrate 200 can be adjusted by a height adjusting unit 320. In one embodiment, the second mask member 330 may be disposed at a second height H1 higher than the first height inside of the third chamber 110" by the height adjusting unit 320. In this case, the second mask member 330 may be in close contact with the upper surface of the substrate 200 at the second height H1, or may be spaced apart from the upper surface of the substrate 200. Hereinafter, the case where the second mask member 330 is spaced apart from the upper surface of the substrate 200 at the second height H1 will be exemplified. In some embodiments, the second mask member may also be disposed at a third height lower than the first height inside the third chamber.

In addition, by adjusting the arrangement height of the second mask member 330 with respect to the substrate 200 by the height adjusting unit 320, the deposition area of the encapsulation layer through the mask pattern 332 of the second mask pattern 330 can be adjusted. For example, when the distance between the substrate 200 and the second mask member 330 increases (when the arrangement height of the first mask member with respect to the substrate increases), the deposition area of the third encapsulation layer 223 deposited by the mask pattern 332 can be increased (widely deposited). On the contrary, when the distance between the substrate 200 and the second mask member 330 decreases, the deposition area of the third encapsulation layer 223 deposited by the mask pattern 332 of the second mask member 330 can be reduced.

Also, a second alignment unit 140" may be provided inside the third chamber 110" performing the alignment of the second mask member 330 with respect to the substrate 200 (or the alignment of the substrate with respect to the second mask member) before the third encapsulation layer 223 is formed.

The second alignment unit 140" may align the second mask member 330 with respect to the substrate 200 after the second mask member 330 enters the third chamber 110". In one embodiment, the second alignment unit 140" may include a photographing unit and a mask member moving unit. The photographing unit may photographs a target mark (or an object mark) formed on the substrate 200 and an object mark (or a target mark) formed on the second mask member 330. The mask member moving unit may move the second mask member 330 by a distance and a direction error between the target mark and the object mark which are photographed by the photographing unit. In some embodiments, the second alignment unit 140" may be provided with other structures capable of aligning the second mask member 330 with respect to the substrate 200, and the present invention is not limited by the structure of the second alignment unit 140".

The photographing unit may be provided to photograph the target mark and the object mark. In one embodiment, a typical camera such as a vision camera may be used as the photographing unit.

The mask member moving unit may be configured to move the mask member support 302, which supports the undersurface of the second mask member 330, in three axis directions (e.g., X axis, Y axis, Z axis or R axis, θ Axis, Z axis) by a typical drive unit.

In addition, the height adjusting unit 320 may perform a role of the mask member moving unit performing the alignment of the second mask member 330 with respect to the substrate 200 in addition to the adjustment of the vertical height of the second mask member 330 with respect to the substrate 200. In some embodiments, the height adjusting unit may also be provided separately from the mask member moving unit.

Meanwhile, while the substrate 200 is sequentially processed through the first chamber 110, the second chamber 110' and the third chamber 110", the first encapsulation layer 221, the second encapsulation layer 222 and the third encapsulation layer 223 may be sequentially laminated over the upper surface of the substrate 200 to form a multilayer encapsulation thin layer 220.

In addition, the first encapsulation layer 221 may be formed of an inorganic film, and the second encapsulation layer 222 may be formed of an organic film. Also, the third encapsulation layer 223 may be formed of an inorganic film. For reference, since the inorganic film is difficult to be formed to have a certain thickness or more, the second encapsulation layer 222 formed of an organic film serving as a buffer layer needs to be formed between the first encapsulation layer 221 and the third encapsulation layer 223. Thus, it is possible to extend the penetration time taken for oxygen and moisture to infiltrate into the encapsulation layer 220.

Preferably, by forming the third encapsulation layer 223 while the second mask member 330 is spaced apart from the substrate 200 by the second height, the edge portion of the multilayer encapsulation thin layer 220 may be tapered so as to downwardly incline from the upper portion to the lower portion thereof. In other words, the edge portion of the multilayer encapsulation thin layer 220 may be tapered to have a wider width (see W1<W2) from the upper portion to the lower portion thereof.

That is, since the deposition area by the mask pattern 332 of the second mask member 330 can be increased by allowing the second mask member 330 to be spaced apart from the upper surface of the substrate 200, that is, since the deposition can be performed in an area larger than the area of the mask pattern 332 of the second mask member 330, the third encapsulation layer 223 may be widely formed so as to cover not only the upper surface of the device 210 but also the peripheral portion of the edge portion of the device 210.

Figure 12:
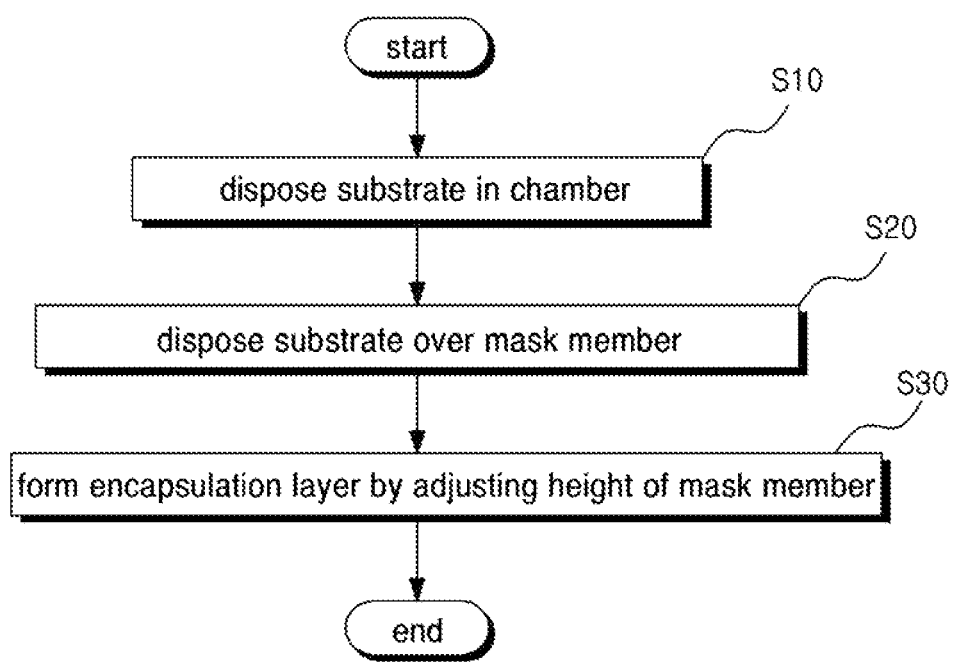
FIG. 12 is a view illustrating a substrate processing method according an embodiment of the present invention.

FIG. 12 is a block diagram illustrating a substrate processing method according an embodiment of the present invention. Also, FIGS. 13 to 16 are block diagrams illustrating a substrate processing method according to another embodiment of the present invention. For parts equivalent to and similar to the configurations described above, the same reference numerals will be assigned, and detailed descriptions thereof will be omitted.

Referring to FIG. 12, a substrate processing method according an embodiment of the present invention may include disposing a substrate 200 in a first chamber 110 (S10), disposing mask members 310 and 330 on the upper surface of the substrate 200 in the first chamber 110 (S20), and forming encapsulation layers 221 and 223 covering a device 210 formed in the substrate 200 by adjusting the arrangement heights H1 and H2 of the mask members 310 and 330 with respect to the substrate 200 (S30).

Operation 1-1:

First, a substrate 200 may be disposed inside a first chamber 110 (S10).

In operation S10, the substrate 200 may be introduced into the first chamber 110 through an entrance formed in the side wall of the first chamber 110. The substrate 200 introduced into the first chamber 110 may be supported by a substrate support 202, and then may be disposed over a susceptor 120 (see FIG. 1).

Operation 1-2:

Next, the mask members 310 and 330 may be disposed over the substrate 200 in the first chamber 110 (S20).

In operation S20, the mask members 310 and 330 may be introduced into the first chamber 110 through an entrance formed in the side wall of the first chamber 110. The mask members 310 and 330 introduced into the first chamber 110 may be supported by a mask member support 302.

Mask patterns 312 and 332 for forming the encapsulation layers 221 and 223 may be formed in the mask members 310 and 330, and the encapsulation layers 221 and 223 may be formed through deposition on the area of the mask patterns 312 and 332. In one embodiment, the mask member may include a mask plate and a mask sheet attached to the mask plate, and the mask pattern may be formed on the mask sheet. In some embodiments, the mask pattern may be directly formed on the mask plate without a separate mask sheet.

Operation 1-3:

Next, the encapsulation layers 221 and 223 may be formed to cover a device 210 formed on the substrate 200 by adjusting the arrangement heights H1 and H2 of the mask members 310 and 330 with respect to the substrate 200 (S30).

Here, the device 210 formed on the substrate 200 may denote an object that is formed on the upper surface of the substrate 200 and is encapsulated by the encapsulation layers 221 and 223. For example, an Organic Light Emitting Diode (OLED) may be formed on the upper surface of the substrate 200. The encapsulation layers 221 and 223 may cover the organic light emitting diode to prevent degradation in performance and lifespan due to exposure of the OLED to oxygen and moisture in the air.

In operation S30, the encapsulation layers 221 and 223 may be formed by the mask members 310 and 330 spaced from (or in close contact with) the substrate 200.

In this case, the deposition areas of the encapsulation layers 221 and 223 may be adjusted according to the arrangement heights H1 and H2 of the mask members 310 and 330 determined in operation S20. More specifically, when the distance between the substrate 200 and the mask members 310 and 330 increases (when the arrangement height of the first mask member with respect to the substrate increases), the deposition area of the encapsulation layers 221 and 223 deposited by the mask patterns 312 and 332 of the mask member 310 and 330 may be increased (widely deposited). On the contrary, when the distance between the substrate 200 and the mask members 310 and 330 decreases, the deposition area of the encapsulation layers 221 and 223 deposited by the mask patterns 312 and 332 of the mask members 310 and 330 may be reduced.

Preferably, in operation S30, the encapsulation layers 221 and 223 may be formed of an inorganic film. In some embodiments, the encapsulation layer may also be formed of other materials instead of the inorganic film.

More preferably, in operation S30, the edge portion of the encapsulation layers 221 and 223 may be tapered so as to have a wider width from the upper portion to the lower portion thereof.

That is, in operation S30, by forming the encapsulation layers 221 and 223 while the mask members 310 and 330 are spaced apart from the substrate 200, the edge portions of the encapsulation layers 221 and 223 may be tapered so as to downwardly incline from the upper portion to the lower portion thereof. In other words, the edge portions of the encapsulation layers 221 and 223 may be tapered to have a wider width (see W1<W2) from the upper portion to the lower portion thereof (see FIGS. 4 and 5).

Thus, since the deposition area by the mask patterns 312 and 332 of the mask members 310 and 330 can be increased by allowing the mask members 310 and 330 to be spaced apart from the upper surface of the substrate 200, that is, since the deposition can be performed in an area larger than the area of the mask patterns 312 and 332 of the mask members 310 and 330, the encapsulation layers 221 and 223 may be widely formed so as to cover not only the upper surface of the device 210 but also the peripheral portion of the edge portion of the device 210.

If the edge portion of the encapsulation layer is vertically formed (a rectangular structure in which the widths of the upper and lower portion of the edge portion are equal to each other), moisture may easily penetrate through the edge portion of the encapsulation layer, and thus the yield may be significantly reduced. Also, the incidence of dark spots (or block spots) may increase. On the other hand, when the edge portions of the encapsulation layers 221 and 223 are tapered like this embodiment, the moisture infiltration at the edge portions of the encapsulation layers 221 and 223 can be blocked. Accordingly, the yield reduction according to the moisture infiltration can be prevented, and the occurrence rate of dark spot can also be reduced.

Figure 13:
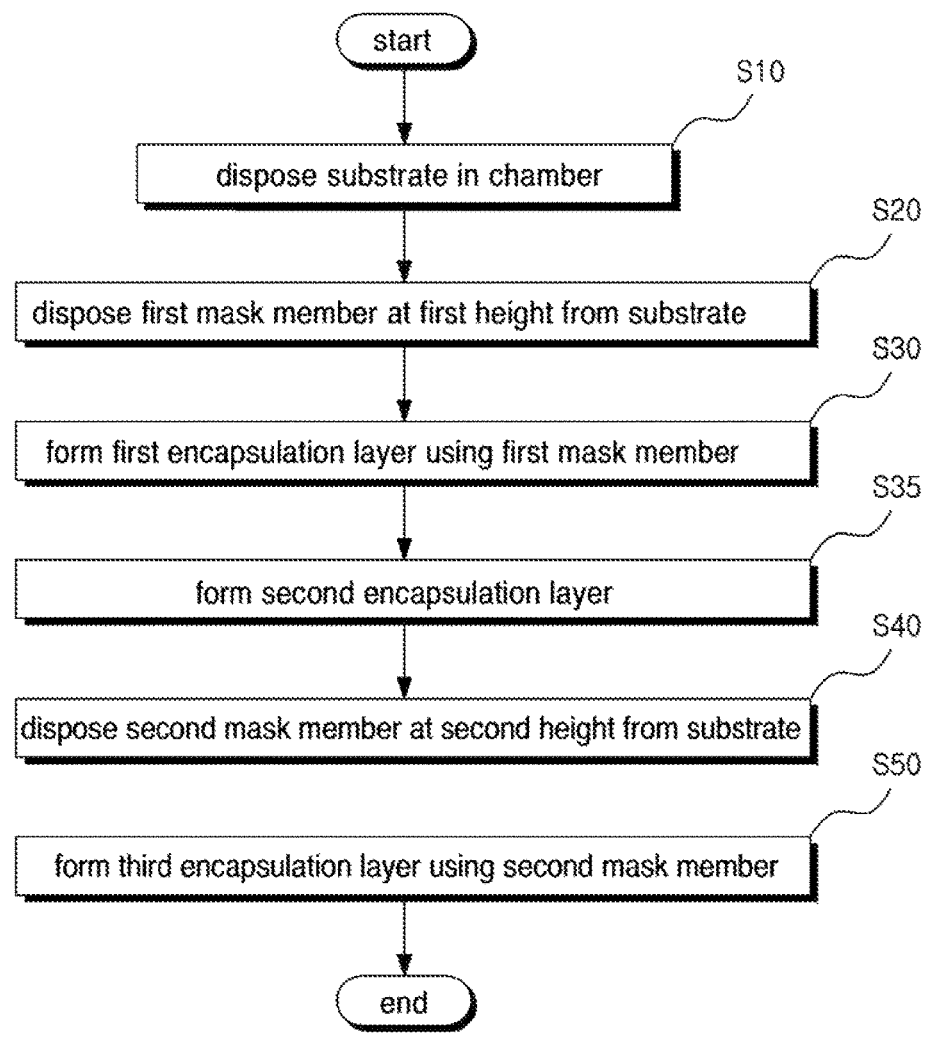
FIGS. 13 to 16 are views illustrating a substrate processing method according to another embodiment of the present invention.
Figure 14:
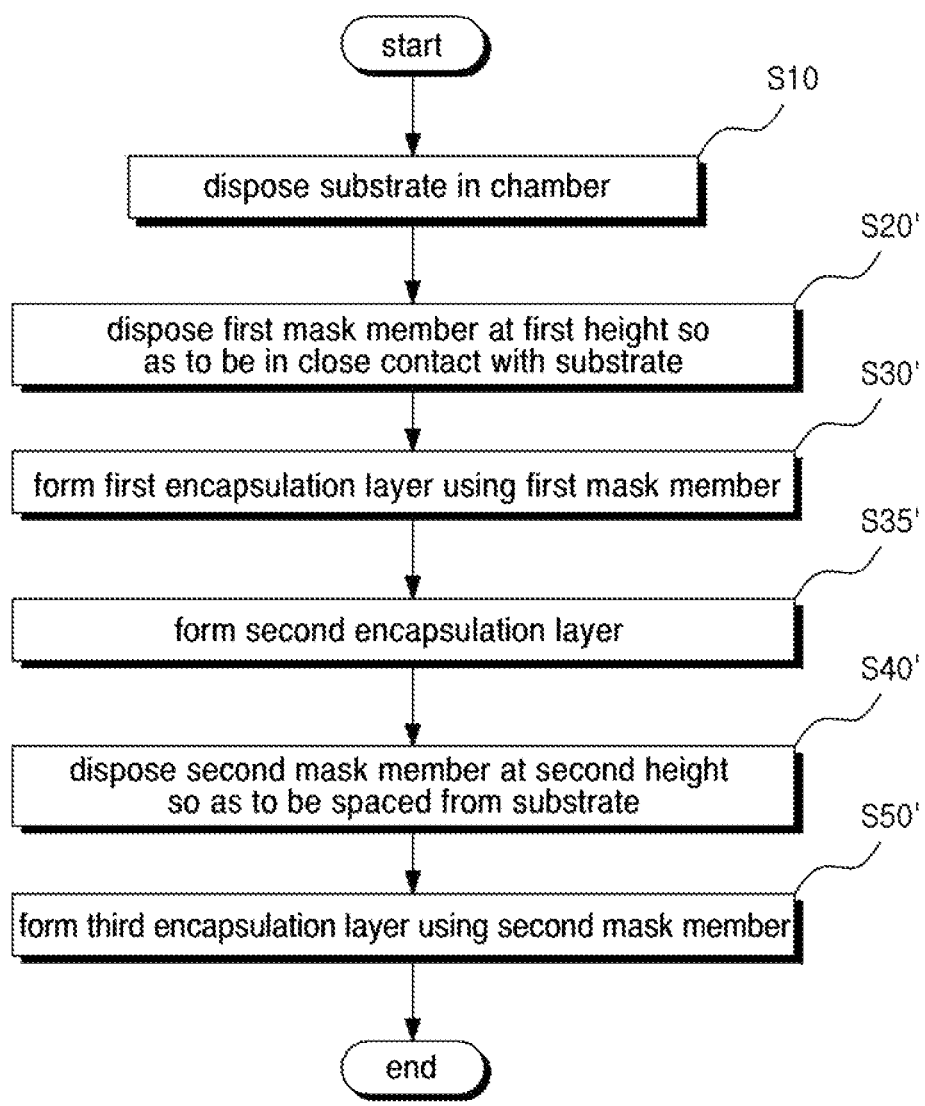

Referring to FIGS. 13 and 14, a substrate processing method according to another embodiment of the present invention may include disposing a substrate 200 in a first chamber 110 (S10), disposing a first mask member 310 in the first chamber 110 such that the first mask member 310 is spaced from the upper surface of the substrate 200 by a predetermined first height H1 (S20), forming a first encapsulation layer 221 covering a device formed on the substrate 200 using the first mask member 310 (S30), disposing a second mask member 330 at a second height different from the first height H1 with respect to the substrate 200 (S40), and forming a third encapsulation layer 223 covering the device formed on the substrate 200 using the second mask member 330 (S50).

Operation 2-1:

First, a substrate 200 may be disposed inside a first chamber 110 (S10).

In operation S10, the substrate 200 may be introduced into the first chamber 110 through an entrance formed in the side wall of the first chamber 110. The substrate 200 introduced into the first chamber 110 may be supported by the support 202 of the substrate 200, and then may be disposed over the susceptor 120 (see FIG. 1).

Operation 2-2:

Next, the first mask member 310 may be disposed in the first chamber 110 such that the first mask member 310 is disposed at a predetermined first height H1 with respect to the upper surface of the substrate 200 (S20).

In operation S20, the first mask member 310 may be introduced into the first chamber 110 through an entrance formed in the side wall of the first chamber 110. The first mask member 310 introduced into the first chamber 110 may be supported by a mask member support 302.

A mask pattern 312 for forming a first encapsulation layer 221 may be formed in the first mask member 310, and the first encapsulation layer 221 may be formed through deposition on the region of the mask pattern 312. In one embodiment, the mask member may include a mask plate and a mask sheet attached to the mask plate, and the mask pattern may be formed on the mask sheet. In some embodiments, the mask pattern may be directly formed on the mask plate without a separate mask sheet.

In operation S20, the arrangement height (first height) of the first mask member 310 may be variously changed in accordance with the required conditions and the deposition environment, and the present invention is not limited by the first height H1.

Operation 2-3:

Next, the first encapsulation layer 221 covering the device formed on the substrate 200 may be formed using the first mask member 310 (S30).

Here, the device 210 formed on the substrate 200 may denote an object that is formed on the upper surface of the substrate 200 and is encapsulated by the first encapsulation layer 221. For example, the Organic Light Emitting Diode (OLED) may be formed on the upper surface of the substrate 200. The first encapsulation layer 221 may cover the organic light emitting diode to prevent degradation in performance and lifespan due to exposure of the organic light emitting diode to oxygen and moisture in the air.

In operation S30, the first encapsulation layer 221 may be formed by the first mask member 310 disposed at the first height H1 spaced from the substrate 200 (see FIG. 2).

In this case, the deposition area of the first encapsulation layer 221 may be adjusted according to the first height H1 of the first mask member 310 determined in operation S20. More specifically, when the distance (first height) between the substrate 200 and the first mask member 310 increases (when the arrangement height of the first mask member with respect to the substrate increases), the deposition area of the first encapsulation layer 221 deposited by the mask pattern 312 can be increased (widely deposited). On the contrary, when the distance between the substrate 200 and the first mask member 310 decreases, the deposition area of the first encapsulation layer 221 deposited by the mask pattern 312 of the first mask member 310 can be reduced.

Preferably, in operation S30, the first encapsulation layer 221 may be formed of an inorganic film. In some embodiments, the first encapsulation layer may also be formed of other materials instead of the inorganic film.

On the other hand, the substrate processing method may include forming a second encapsulation layer (222 of FIG. 3) over the substrate 200 on which the first encapsulation layer 221 is formed (S35).

In operation S35, the substrate 200 may be transferred to a second chamber 110', and the second encapsulation layer 222 may be formed over the upper surface of the substrate 200 (the upper surface of the first encapsulation layer 221) in the second chamber 110'. Preferably, the second encapsulation layer 222 may be formed of an organic film, and may be formed so as to partially cover the upper surface of the first encapsulation layer 221.

In operation S35, the second encapsulation layer 222 may be formed by various methods in accordance with the required conditions and the design specifications.

In one embodiment, an inkjet printer 320' for inkjet-printing the second encapsulation layer 222 may be provided in the second chamber 110', and in operation S35, the second encapsulation layer 222 may be formed through inkjet-printing. In some embodiments, it is also possible to deposit the second encapsulation layer in a vacuum state inside the second chamber.

Operation 2-4:

Next, the second mask member 330 may be disposed in the first chamber 110 such that the second mask member 330 is disposed at a second height different from the first height H1 with respect to the substrate 200 (S40).

In operation S40, the second mask member 330 may be introduced into the first chamber 110 through the entrance formed in the side wall of the first chamber 110. The second mask member 330 introduced into the first chamber 110 may be supported by the mask member support 302.

In this case, the same mask pattern 332 as the first mask member 310 may be formed in the second mask member 330. Here, when the second mask member 330 has the same mask pattern (312=332) as the first mask member 310, the first mask member 310 and the second mask member 330 may be defined as having the same size and layer properties and having the mask patterns 312 and 332 of the same size and shape. In other words, it is understood that only one kind of mask member that is standardized (or already established) as the first mask member 310 and the second mask member 330 is used.

In one embodiment, as the first mask member 310 and the second mask member 330, only one type of mask member that is standardized (or already established) may be used. In other words, one of two mask members equally formed so as to have the same standard as each other may be used as the first mask member 310 in operation S20, and the other may be used as the second mask member 330 in operation S40.

In another embodiment, in operation S40, the second mask member 330 may be the first mask member 310 disposed at the second height. In other words, only one common mask member may be used as the first mask member 310 and the second mask member 330. Here, when the common mask member is disposed at the first height H1, the common mask member may be used as the first mask member 310, and when the common mask member is disposed at the second height in operation S40, the common mask member may be used as the second mask member 330.

In operation S40, the second mask member 330 may be in close contact with the upper surface of the substrate 200 at the second height, or may be spaced apart from the upper surface of the substrate 200. In operation S40, the second mask member 330 may be spaced from the upper surface of the substrate 200 by the second height H2, and the second height (see H2 of FIG. 4) may be set larger than the first height (see H1 of FIG. 2). In some embodiments, the second mask member may also be disposed at the second height lower than the first height H1.

Operation 2-5:

Next, the third encapsulation layer 223 covering the device formed on the substrate 200 may be formed using the second mask member 330 (S50).

In operation S50, the third encapsulation layer 223 may be formed by the second mask member 330 disposed at the second height spaced from the substrate 200 (see FIG. 4).

In this case, the deposition area of the third encapsulation layer 223 may be adjusted according to the second height of the second mask member 330 determined in operation S40. More specifically, when the distance between the substrate 200 and the second mask member 330 increases (when the arrangement height of the first mask member with respect to the substrate increases), the deposition area of the third encapsulation layer 223 deposited by the mask pattern 332 can be increased (widely deposited). On the contrary, when the distance between the substrate 200 and the second mask member 330 decreases, the deposition area of the third encapsulation layer 223 deposited by the mask pattern 332 of the second mask member 330 can be reduced.

Preferably, in operation S50, the third encapsulation layer 223 may be formed of an inorganic film. In some embodiments, the third encapsulation layer may also be formed of other materials instead of the inorganic film.

On the other hand, in FIG. 13, it has been described that the first encapsulation layer 221 is first formed while the first mask member 310 is being spaced from the substrate 200 and then the third encapsulation layer 223 is formed while the second mask member 330 is being spaced from the substrate 200. However, as shown in FIG. 14, the first encapsulation layer 221 may also be first formed while the first mask member 310 is in close contact with the substrate 200, and then the third encapsulation layer 223 may be formed while the second mask member 330 is being spaced from the substrate 200. Also, as shown in FIG. 14, before the third encapsulation layer 223 is formed after the first encapsulation layer 221 is formed, the second encapsulation layer 222 may be formed (S35').

Figure 15:
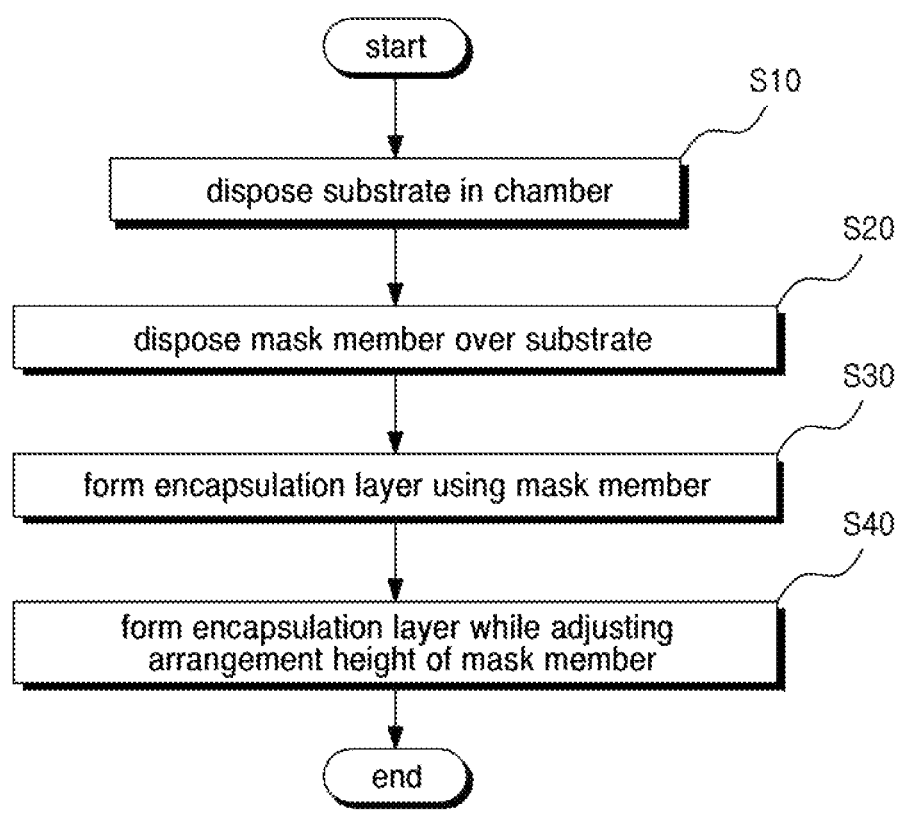

Referring to FIG. 15, a substrate processing method according to another embodiment of the present invention may include disposing a substrate 200 in a first chamber 110 (S10), disposing a first mask member 310 over the substrate 200 in the first chamber 110 (S20), forming a first encapsulation layer 221' covering a device formed on the substrate 200 using the first mask member 310 (S30), and adjusting an arrangement height of the first mask member 310 with respect to the substrate 200 such that the deposition area by the first mask member 310 is adjusted while the first encapsulation layer 221' is being formed (S40).

Operation 3-1:

First, the substrate 200 may be disposed inside the first chamber 110 (S10).

In operation S10, the substrate 200 may be introduced into the first chamber 110 through an entrance formed in the side wall of the first chamber 110. The substrate 200 introduced into the first chamber 110 may be supported by the support 202 of the substrate 200, and then may be disposed over the susceptor 120 (see FIG. 1).

Operation 3-2:

Next, the first mask member 310 may be disposed over the substrate 200 in the first chamber 110 (S20).

In operation S20, the first mask member 310 may be introduced into the first chamber 110 through an entrance formed in the side wall of the first chamber 110. The first mask member 310 introduced into the first chamber 110 may be supported by a mask member support 302.

A mask pattern 312 for forming an encapsulation layer may be formed in the first mask member 310, and a first encapsulation layer 221' may be formed through deposition on the region of the mask pattern 312. In operation S20, the arrangement height (first height) of the first mask member 310 may be variously changed in accordance with the required conditions and the deposition environment, and the present invention is not limited by the first height H1.

Also, in operation S20, the first mask member 310 may be disposed at a predetermined first height H1 with respect to the upper surface of the substrate 200, and in this case, may be adhered closely to or spaced from the upper surface of the substrate 200 at the first height H1.

Operation 3-3:

Next, the first encapsulation layer (see 221' of FIG. 9) covering the device formed on the substrate 200 may be formed using the first mask member 310 (S30).

In operation S30, the first encapsulation layer 221' may be formed by the first mask member 310 disposed at the first height H1, for example, spaced from the substrate 200.

Preferably, in operation S30, the first encapsulation layer 221' may be formed of an inorganic film. In some embodiments, the first encapsulation layer may also be formed of other materials instead of the inorganic film.

Operation 3-4:

Next, while the first encapsulation layer 221' is being formed, the arrangement height of the first mask member 310 with respect to the substrate 200 may be adjusted such that the deposition area by the first mask member 310 is adjusted (S40).

In operation S40, by adjusting the arrangement height of the first mask member 310 with respect to the substrate 200, while the first encapsulation layer 221' is being formed (while a process gas is being supplied into the chamber and the deposition process is being performed by the first mask member), the deposition area of the first encapsulation layer 221' by the first mask member 310 may be continuously adjusted.

Thus, in operation S40, since the height of the first mask member 310 with respect to the substrate 200 can be adjusted while the deposition process is being performed by the first mask member 310, it is possible to form the first encapsulation layer 221' formed of a single material into a multilayered structure (in which encapsulation layers having different deposition areas are successively laminated). Particularly, in this embodiment, since the first encapsulation layer 221' having a multi-layered structure can be formed using only one type of the first mask member 310, the manufacturing cost of the mask member can be reduced, and the manufacturing structure and manufacturing process of the encapsulation layer can be simplified. Also, it is possible to form encapsulation layers of various structures.

In operation S40, by gradually increasing the arrangement height of the first mask member 310 while the first encapsulation layer 221' is being formed, the edge portion of the first encapsulation layer 221' can be tapered so as to downwardly incline from the upper portion to the lower portion thereof. In some embodiments, it is also possible to gradually reduce the arrangement height of the first mask member while the first encapsulation layer is being formed in operation S40.

In some embodiments, by gradually adjusting the arrangement of the second mask member with respect to the substrate after the first encapsulation layer covering the device is formed using the first mask member fixedly disposed at the first height, it is possible to form a third encapsulation layer of a multi-layered structure over the first encapsulation layer.

Figure 16:
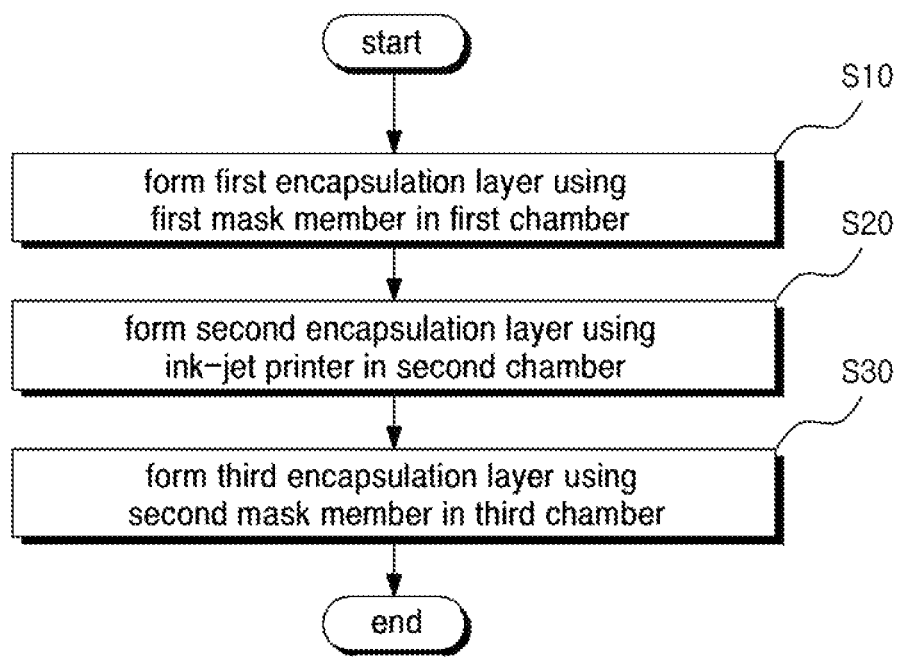

Referring to FIG. 16, a substrate processing method according an embodiment of the present invention may include forming a first encapsulation layer 221 using a first mask member 310 in a first chamber 110 so as to cover a device 210 formed on the upper surface of a substrate 200 (S10), forming a second encapsulation layer 222 on the upper surface of the first encapsulation layer 221 in a second chamber 110' (S20), and forming a third encapsulation layer (223) on the upper surface of the second encapsulation layer (222) in a third chamber 110" using a second mask member 330 having the same mask pattern 332 as the first mask member 310 (S30).

Operation 4-1:

First, the first encapsulation layer 221 may be formed using the first mask member 310 in the first chamber 110 so as to cover the device formed on the upper surface of the substrate 200 (S10).

The substrate 200 may be introduced into the first chamber 110 through an entrance formed in the side wall of the first chamber 110. The substrate 200 introduced into the first chamber 110 may be supported by the substrate support 202 of the substrate 200, and then may be disposed over the susceptor 120 (see FIG. 1).

In operation S10, the first mask member 310 may be disposed at the first height with respect to the upper surface of the substrate 200 in the first chamber 110, and deposition may be performed through the region of the mask pattern 312 of the first mask member 310 while the first mask member 310 is disposed at the first height over the substrate 200. Thus, the first encapsulation layer 221 may be formed so as to cover the device 210 formed on the substrate 200.

In this case, the first mask member 310 may be in close contact with the upper surface of the substrate 200 at the first height, or may be spaced apart from the upper surface of the substrate 200. Hereinafter, the case where the first mask member 310 is in close contact with the upper surface of the substrate 200 at the first height in operation S10 will be exemplified.

Here, the device 210 formed on the substrate 200 may denote an object that is formed on the upper surface of the substrate 200 and is encapsulated by the first encapsulation layer 221. For example, the Organic Light Emitting Diode (OLED) may be formed on the upper surface of the substrate 200. The first encapsulation layer 221 may cover the organic light emitting diode to prevent degradation in performance and lifespan due to exposure of the organic light emitting diode to oxygen and moisture in the air. Preferably, the first encapsulation layer 221 may be formed of an inorganic film.

Operation 4-2:

Next, the second encapsulation layer 222 may be formed on the upper surface of the first encapsulation layer 221 inside the second chamber 110' (S20).

The substrate on which the first encapsulation layer 221 is formed in operation S10 may be transferred to a second chamber 110', and the second encapsulation layer 222 may be formed over the upper surface of the first encapsulation layer 221 while the substrate is disposed in the second chamber 110'.

In operation S20, the second encapsulation layer 222 may be formed of an organic film, and may be formed so as to partially cover the upper surface of the first encapsulation layer 221.

In operation S20, the second encapsulation layer 222 may be formed by various methods in accordance with the required conditions and the design specifications.

In one embodiment, an inkjet printer 320 for inkjet-printing the second encapsulation layer 222 may be provided in the second chamber 110', and in operation S20, the second encapsulation layer 222 may be formed through inkjet-printing (see FIG. 7). Thus, by forming the second encapsulation layer 222 using the inkjet printer 320 in the second chamber 110', it is possible to simplify the structure and shorten the process of forming the second encapsulation layer 222. In particular, since the inkjet printer 320 can form the second encapsulation layer 222 in an atmospheric pressure state and the working process is very simple and quick, the yield can be improved. In some embodiments, it is also possible to deposit the second encapsulation layer in a vacuum state inside the second chamber.

Operation 4-3:

Next, in the third chamber 110", the third encapsulation layer 223 may be formed over the second encapsulation layer 222 using the second mask member 330 having the same mask pattern 332 as the first mask member 310 (S30).

The substrate 200 over which the second encapsulation layer 222 is formed in operation S20 may be transferred to the third chamber 110" in operation S30. The substrate 200 may be introduced into the third chamber 110" through an entrance formed in the side wall of the third chamber 110". The substrate 200 introduced into the third chamber 110" may be supported by the substrate support 202 of the substrate 200, and then may be disposed over the susceptor 120 (see FIG. 10).

In operation S30, the second mask member 330 may be disposed at a second height higher than the first height in the third chamber 110", and deposition may be performed through the region of the mask pattern 332 of the second mask member 330 while the second mask member 330 is disposed over the substrate 200. Thus, the third encapsulation layer 223 may be formed so as to cover the device formed on the substrate 200 (see FIG. 11).

In this case, the second mask member 330 may be in close contact with the upper surface of the substrate 200 at the second height, or may be spaced apart from the upper surface of the substrate 200. Hereinafter, the case where the second mask member 330 is spaced from the upper surface of the substrate 200 at the second height in operation S30 will be exemplified.

For reference, in operation S30, the second mask member 330 having the same mask pattern 332 as the first mask member 310 may be used. Here, when the second mask member 330 has the same mask patterns 312 and 332 as the first mask member 310, the first mask member 310 and the second mask member 330 may be defined as having the same size and layer properties and having the mask patterns of the same size and shape. In other words, it is understood that only one kind of mask member that is standardized (or already established) as the first mask member 310 and the second mask member 330 is used.

In operation S30, the third encapsulation layer 223 may be formed of an organic film, and may be formed so as to wholly cover the upper surface of the second encapsulation layer 222.

Thus, the first encapsulation layer 221, the second encapsulation layer 222 and the third encapsulation layer 223 may be sequentially laminated over the upper surface of the substrate 200 to form a multilayer encapsulation thin layer 220.

Since the inorganic film is difficult to be formed to have a certain thickness or more, the second encapsulation layer 222 formed of an organic film serving as a buffer layer needs to be formed between the first encapsulation layer 221 and the third encapsulation layer 223. Thus, it is possible to extend the penetration time taken for oxygen and moisture to infiltrate into the encapsulation layer 220.

Also, in operation S30, by forming the third encapsulation layer 223 while the second mask member 330 is spaced apart from the substrate 200 by the second height, the edge portion of the multilayer encapsulation thin layer 220 may be tapered so as to downwardly incline from the upper portion to the lower portion thereof. In other words, the edge portion of the multilayer encapsulation thin layer 220 may be tapered to have a wider width (see W1<W2) from the upper portion to the lower portion thereof.

That is, in operation S30, since the deposition area by the mask pattern 332 of the second mask member 330 can be increased by allowing the second mask member 330 to be spaced apart from the upper surface of the substrate 200, that is, since the deposition can be performed in an area larger than the area of the mask pattern 332 of the second mask member 330, the third encapsulation layer 223 may be widely formed so as to cover not only the upper surface of the device 210 but also the peripheral portion of the edge portion of the device 210.

When the edge portion of the multilayer encapsulation thin layer 220 is vertically formed (a rectangular structure in which the widths of the upper and lower portion of the edge portion are equal to each other), moisture may easily penetrate through the edge portion of the multilayer encapsulation thin layer 220, and thus the yield may be significantly reduced. Also, the incidence of dark spots (or block spots) may increase. On the other hand, when the edge portion of the multilayer encapsulation thin layer 220 is tapered like this embodiment, the moisture infiltration at the edge portion of the multilayer encapsulation thin layer 220 can be blocked. Accordingly, the yield reduction according to the moisture infiltration can be prevented, and the occurrence rate of dark spot can also be reduced.

On the other hand, in operation S30, the first chamber 110 may be commonly used as the third chamber 110" (the chamber is used as the first chamber), and in operation S30, the third encapsulation layer 223 may also be formed on the upper surface of the substrate 200 that returns to the first chamber 110.

In other words, in operation S30, the first chamber 110 may be commonly used as the third chamber 110", and the third encapsulation layer 223 may be formed on the upper surface of the substrate 200 that returns to the first chamber 110 after the second encapsulation layer 222 is formed.

Here, returning of the substrate 200 to the first chamber 110 may mean that the substrate 200 returns to the first chamber (serving as the third chamber) after passing through the first chamber 110 and the second chamber 110'.

Thus, by using a single chamber as the first chamber 110 and the third chamber 110" in common, the equipment can be simplified, and the space necessary for installation of the equipment and the manufacturing cost can be reduced. In some embodiments, the third chamber used in operation S30 may be separately provided independently of the first chamber.

As described above, according an embodiment of the present invention, the manufacturing structure and manufacturing process of the encapsulation layer can be simplified, and the process efficiency can be improved.

Particularly, by adjusting the arrangement height of mask members with respect to the substrate in the chamber and thus forming encapsulation layers of various structures, since it is not necessary to individually prepare different mask members in consideration of different sizes and layer properties for each kind of encapsulation layer, the manufacturing cost of the mask member can be reduced, and the manufacturing structure and manufacturing process of the encapsulation layer can be simplified. Also, it is possible to form encapsulation layers of various structures.

Particularly, by differently setting the arrangement height of the mask members with respect to the substrate and thus adjusting the deposition area by the mask member, different structured encapsulation layers can be formed using a single kind of mask member.

Furthermore, since only one kind of mask member is used to form the encapsulation layers and thus only one kind of mask member enters and exits the chamber, the transferring and storing processes of the mask member can be further simplified.

In other words, encapsulation layers having different structures can be formed using a plurality of different mask members, but in this case, it may be costly and time-consuming to manufacture and maintain a plurality of different mask members, respectively. In addition, since different mask members need to enter and exit the chamber according to the structures of the encapsulation layers and the mask members that have been used need to be stored in separate storage spaces in a predetermined order, the overall processing efficiency is complicated and reduced. However, since different mask members need not to enter and exit the chamber in a predetermined order and different mask members that have been used need not to be stored in separate spaces in a predetermined order by forming different structured encapsulation layers using one kind of mask member, the transferring and storing processing of the mask members can be simplified, and the time (time during which the deposition process stops) taken to dispose the mask members inside the chamber can be significantly shortened.

Also, the mask member may be standardized, and thus the cost and time required for the manufacturing and maintenance of the mask member can be reduced. Also, the replacement period of the mask member can be more efficiently managed.

In addition, by forming an encapsulation layer using only one kind of mask member, the manufacturing errors and process errors of the mask member can be minimized, and the defect rate of the encapsulation layer according to the errors can be minimized.

Furthermore, by using a single chamber as the first chamber and the third chamber in common and forming the first encapsulation layer and the third encapsulation layer in the single chamber, the equipment can be simplified, and the space necessary for installation of the equipment and the manufacturing cost can be reduced.

Also, a multilayer encapsulation thin layer of various structures can be formed while the substrate and the mask member are in non-contact with each other (spaced from each other) in accordance with the required conditions.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing method comprising:
    disposing a substrate inside a chamber;
    disposing a mask member over the substrate inside the chamber; and
    forming an encapsulation layer covering a device formed on the substrate by adjusting an arrangement height of the mask member with respect to the substrate, including at least one height adjusting step in which the arrangement height of the mask member with respect to the substrate is gradually changed during the forming of the encapsulation layer such that the deposition area of the encapsulation layer is continuously adjusted.

2. The substrate processing method of claim 1, wherein the forming of the encapsulation layer comprises:
forming a first encapsulation layer using the mask member; and
forming a second encapsulation layer covering the first encapsulation layer using the mask member,
wherein the height adjusting step is included in at least one of the forming a first encapsulation layer and the forming a second encapsulation layer.

3. The substrate processing method of claim 1, wherein the height adjusting step is performed by gradually increasing the arrangement height of the mask member with respect to the substrate.

4. The substrate processing method of claim 1, wherein the height adjusting step is performed by gradually decreasing the arrangement height of the mask member with respect to the substrate.

5. A substrate processing method comprising:
forming a first encapsulation layer so as to cover a device formed on an upper surface of a substrate using a first mask member inside a first chamber;
forming a second encapsulation layer over the first encapsulation layer inside a second chamber;
forming a third encapsulation layer over the second encapsulation layer inside a third chamber using a second mask member having the same mask pattern as the first mask member formed therein,
including at least one height adjusting step in which the arrangement height of the second mask member with respect to the substrate is gradually changed during the forming of the third encapsulation layer such that the deposition area of the third the encapsulation layer is continuously adjusted.

6. The substrate processing method of claim 5, wherein in the forming of the first encapsulation layer, the first mask member is disposed at a first height with the upper surface of the substrate, and
in the forming of the third encapsulation layer, the second mask member is disposed at a second height higher than the first height.

7. The substrate processing method of claim 5, wherein:
in the forming of the first encapsulation layer, the first encapsulation layer is formed so as to wholly cover the device;
in the forming of the second encapsulation layer, the second encapsulation layer is formed so as to partially cover an upper surface of the first encapsulation layer; and
in the forming of the third encapsulation layer, the third encapsulation layer is formed so as to wholly cover the second encapsulation layer.

8. The substrate processing method of claim 7, wherein the device is formed of an Organic Light Emitting Diode (OLED), and
the first encapsulation layer is formed of an inorganic film, the second encapsulation layer is formed of an organic film, and the third encapsulation layer is formed of an inorganic film.

9. The substrate processing method of claim 5, wherein in the forming of the third encapsulation layer, the first chamber is used as the third chamber in common, and
in the forming of the third encapsulation layer, the third encapsulation layer is formed over the upper surface of the substrate that returns to the first chamber.

10. The substrate processing method of claim 5, wherein the height adjusting step is performed by gradually increasing the arrangement height of the second mask member with respect to the substrate.

11. The substrate processing method of claim 5, wherein the height adjusting step is performed by gradually decreasing the arrangement height of the second mask member with respect to the substrate.

* * * * *